(12) United States Patent
Gardner et al.

(10) Patent No.: US 12,324,206 B2
(45) Date of Patent: Jun. 3, 2025

(54) SEMICONDUCTOR DEVICES AND METHODS OF MANUFACTURING THEREOF

(71) Applicant: Tokyo Electron Limited, Tokyo (JP)

(72) Inventors: Mark I. Gardner, Albany, NY (US); H. Jim Fulford, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 415 days.

(21) Appl. No.: 17/975,352

(22) Filed: Oct. 27, 2022

(65) Prior Publication Data

US 2024/0145576 A1 May 2, 2024

(51) Int. Cl.
| | |
|---|---|
| *H10D 64/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 84/01* | (2025.01) |

(Continued)

(52) U.S. Cl.
CPC ......... *H10D 64/017* (2025.01); *H10D 30/014* (2025.01); *H10D 30/43* (2025.01); *H10D 30/6735* (2025.01); *H10D 30/6741* (2025.01); *H10D 30/6743* (2025.01); *H10D 30/6757* (2025.01); *H10D 62/121* (2025.01); *H10D 62/151* (2025.01); *H10D 64/01* (2025.01); *H10D 64/015* (2025.01); *H10D 64/018* (2025.01); *H10D 64/021* (2025.01); *H10D 84/0167* (2025.01); *H10D 84/017* (2025.01); *H10D 84/0184* (2025.01); *H10D 84/038* (2025.01); *H10D 84/85* (2025.01)

(58) Field of Classification Search
CPC ........... H10D 30/6741; H10D 30/6743; H10D 62/116; H10D 62/822
See application file for complete search history.

(56) References Cited

U.S. PATENT DOCUMENTS

| | | | |
|---|---|---|---|
| 9,024,376 B2* | 5/2015 | Masuoka | H10D 64/514 257/329 |
| 9,425,324 B2* | 8/2016 | Diaz | H10D 30/6758 |

(Continued)

*Primary Examiner* — Mark W Tornow
(74) *Attorney, Agent, or Firm* — Foley & Lardner LLP

(57) ABSTRACT

A method includes forming a fin structure over a substrate, the fin structure including alternating first semiconductor layers and second semiconductor layers stacked along a vertical direction; forming a dummy gate structure over the fin structure; selectively depositing an outer spacer layer on the dummy gate structure; performing a plasma doping process to form source/drain regions in each second semiconductor layer adjacent the dummy gate structure, where a portion of each second semiconductor layer interposing between the source/drain regions defines a channel region; forming a dielectric layer over the fin structure; removing the dummy gate structure to form a gate trench in the dielectric layer; selectively removing the first semiconductor layers to form openings interleaved with the second semiconductor layers; and forming a metal gate structure to fill the gate trench and the openings.

20 Claims, 38 Drawing Sheets

(51) Int. Cl.
 *H10D 84/03* (2025.01)
 *H10D 84/85* (2025.01)

(56) References Cited

U.S. PATENT DOCUMENTS 9,478,624 B2 * 10/2016 Colinge ............... H10D 30/014
2021/0343858 A1 * 11/2021 Wang ................. H10D 30/6757

* cited by examiner

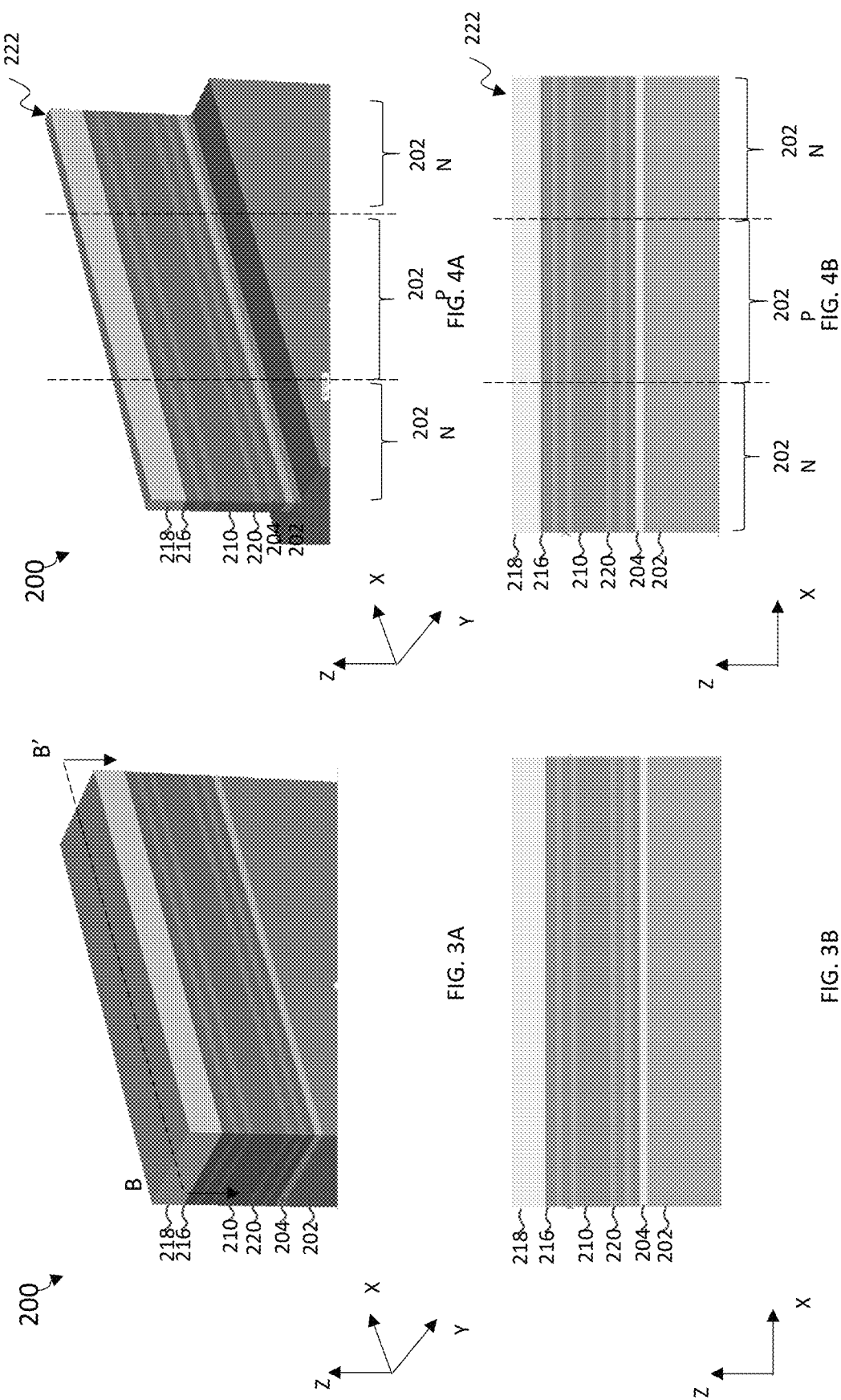

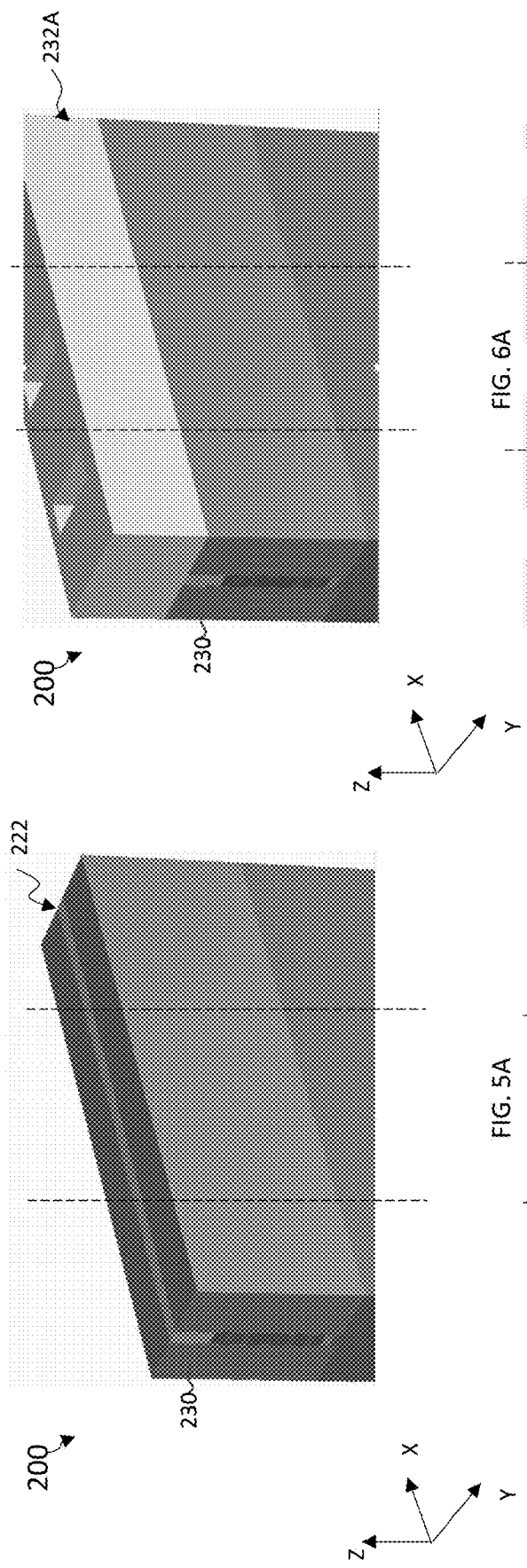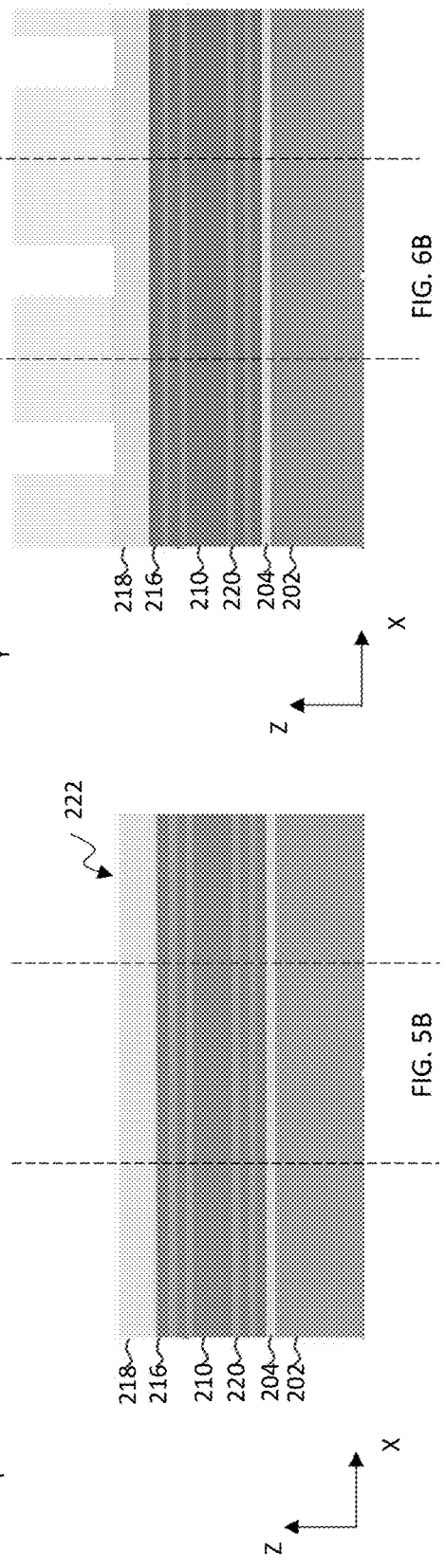

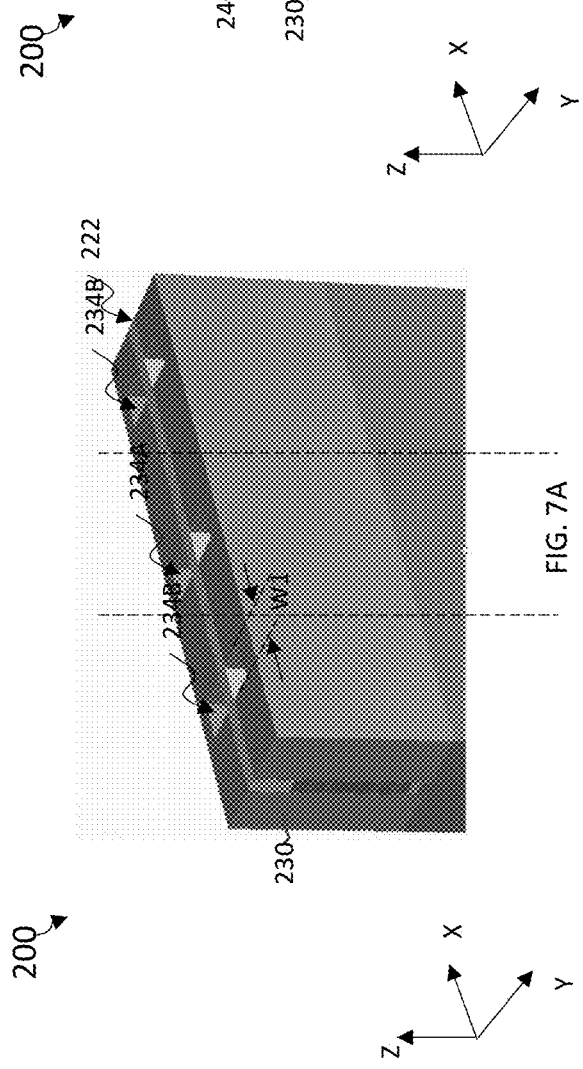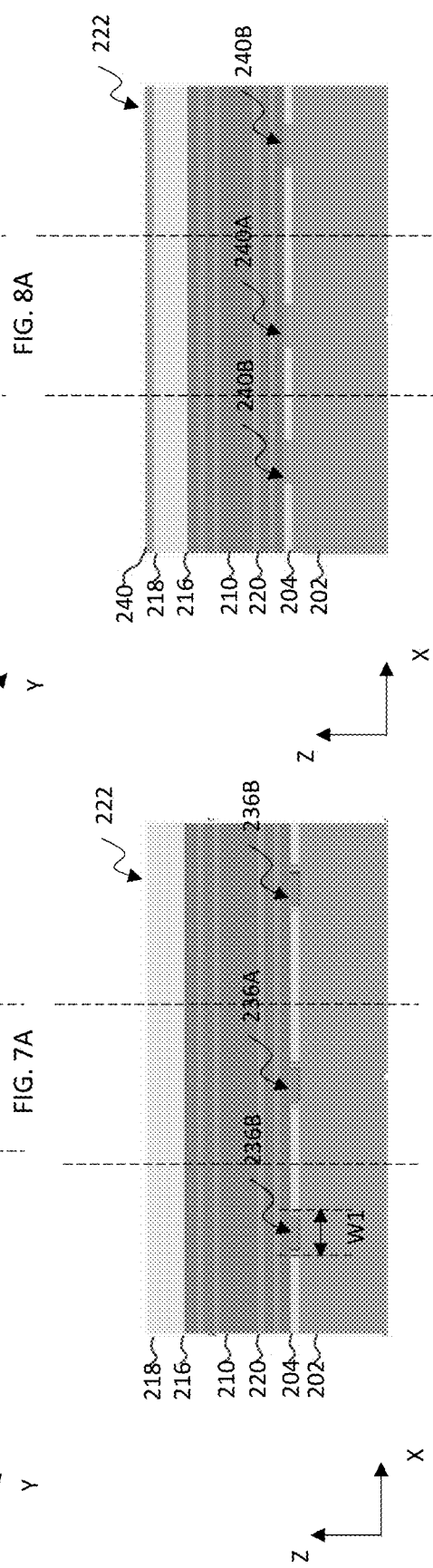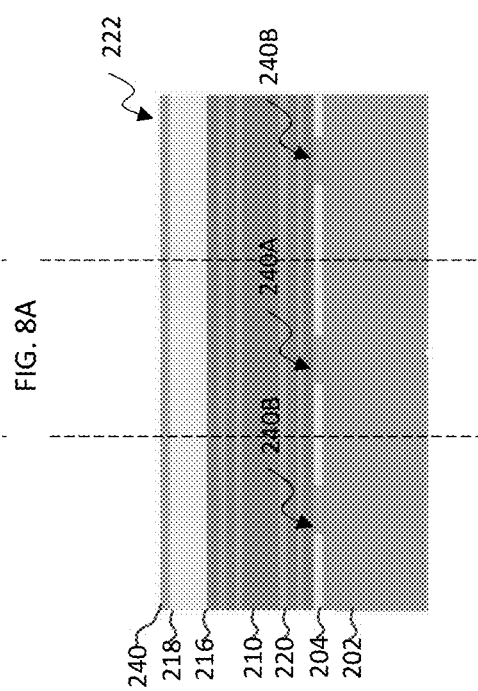

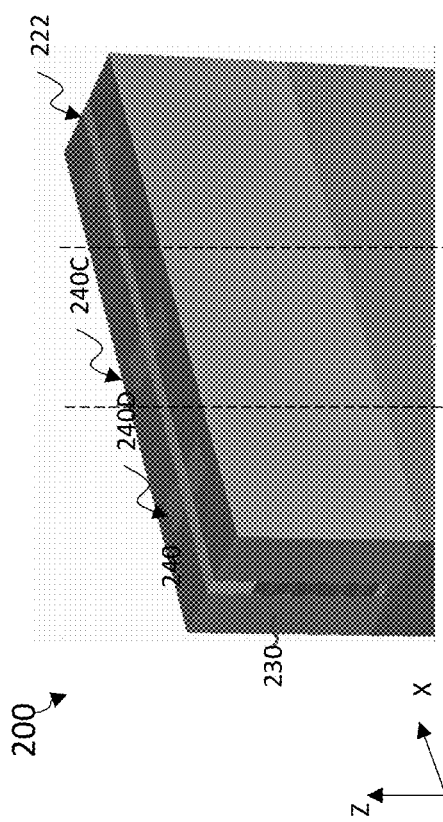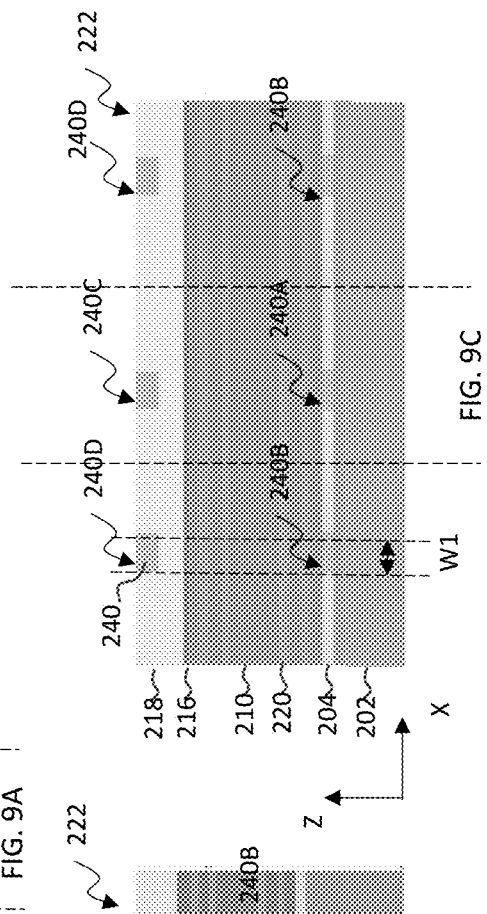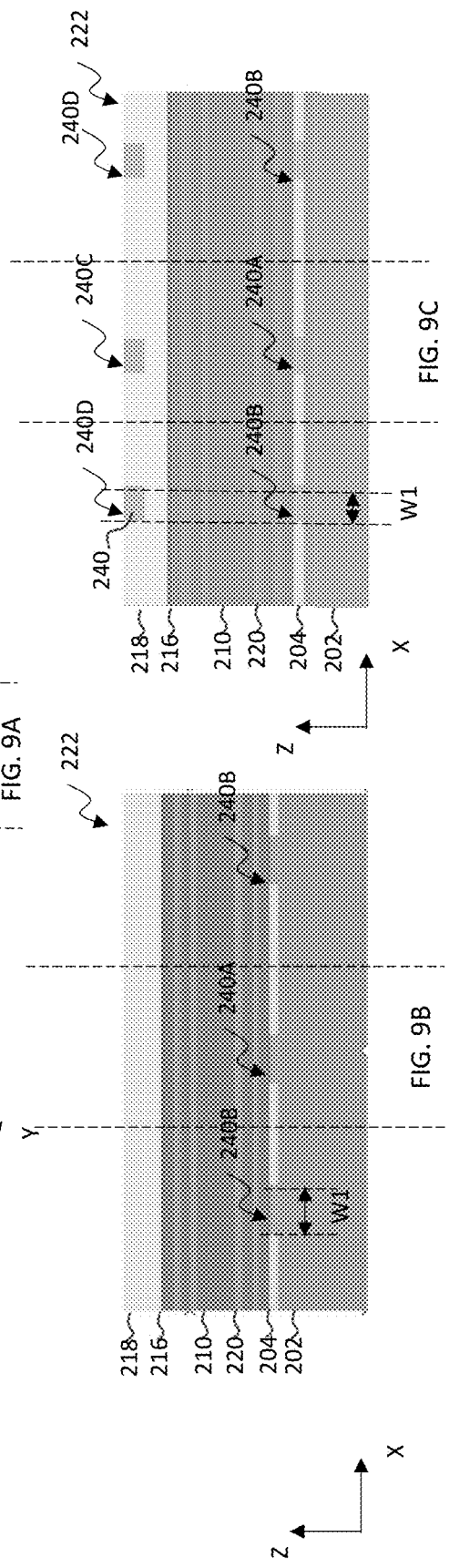

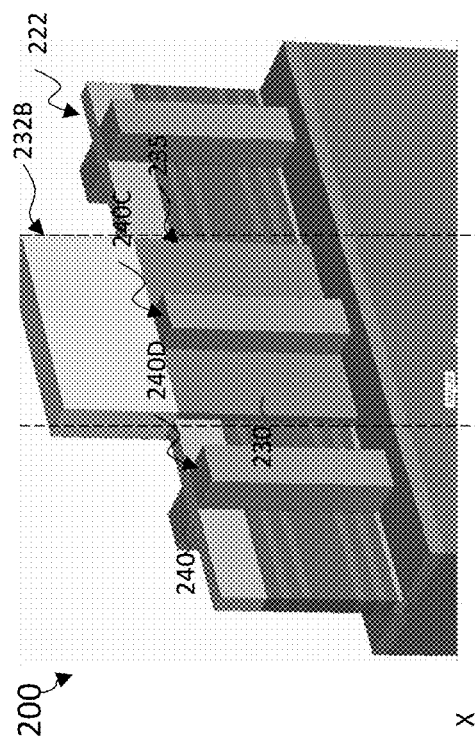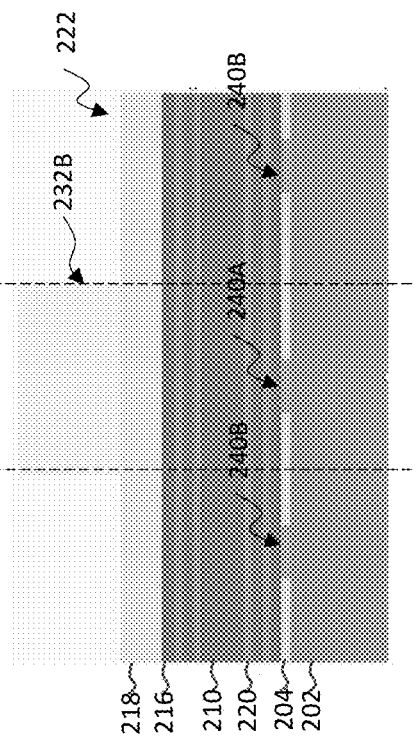
FIG. 10A
FIG. 10B

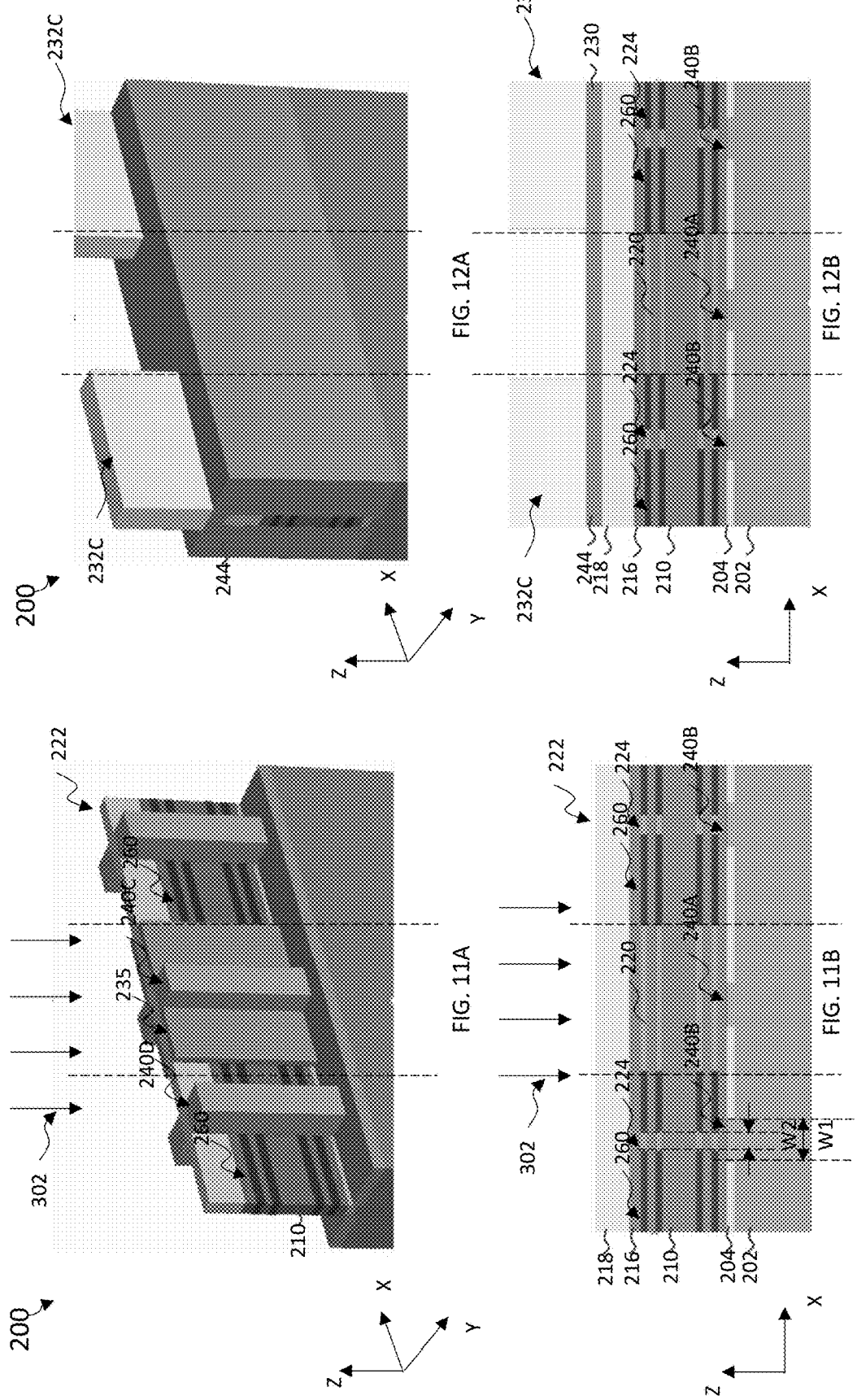

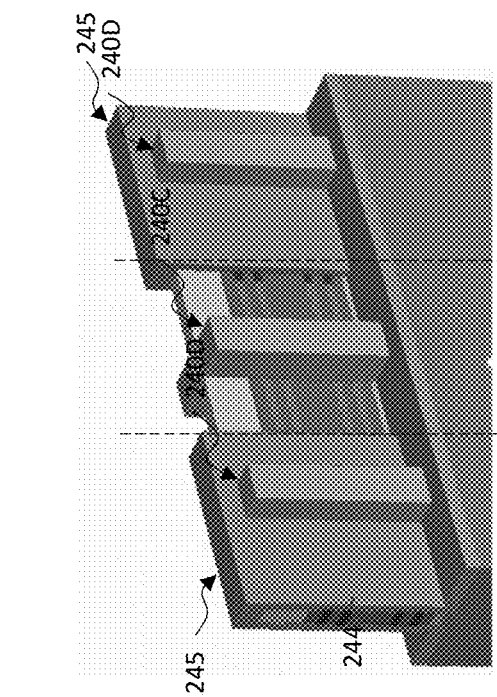
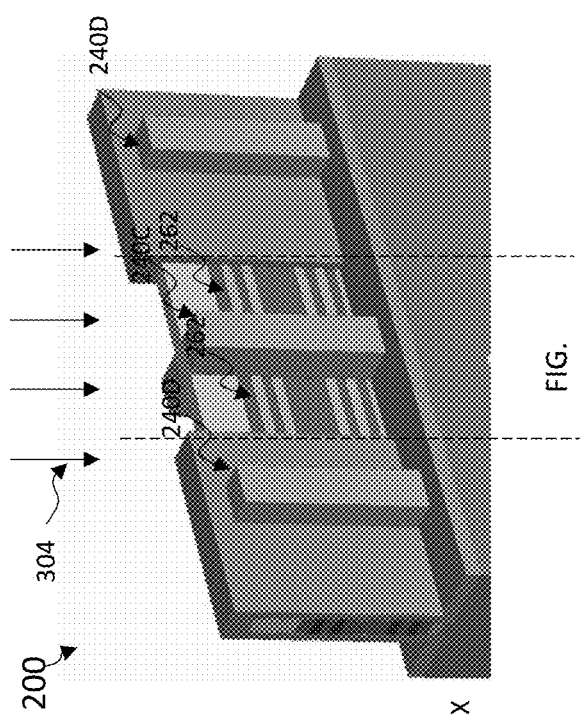
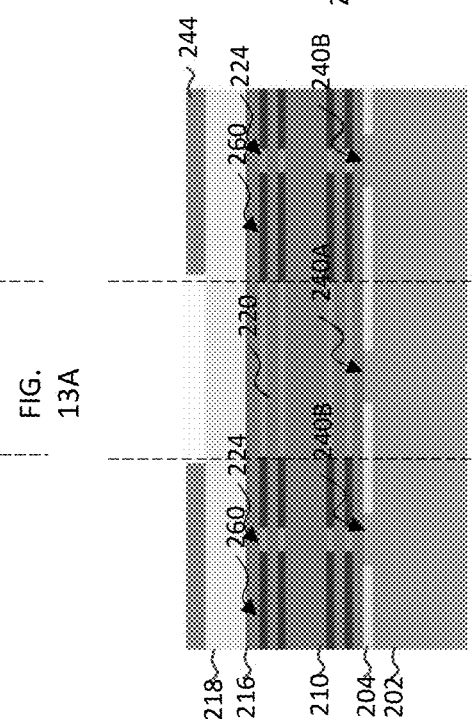
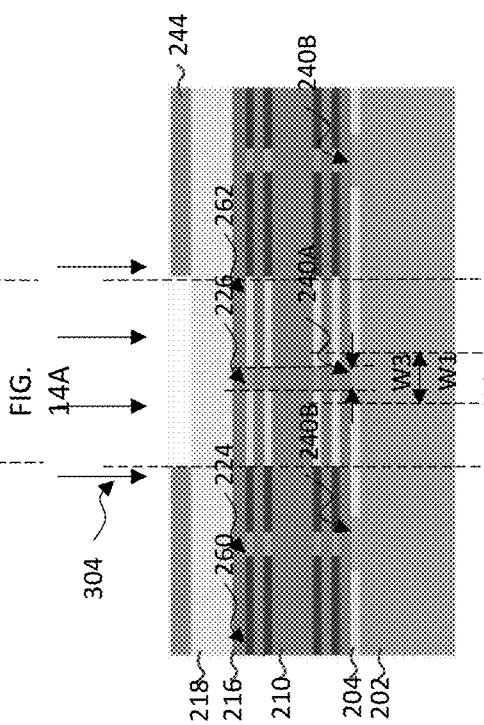
FIG. 13A
FIG. 13B
FIG. 14A
FIG. 14B

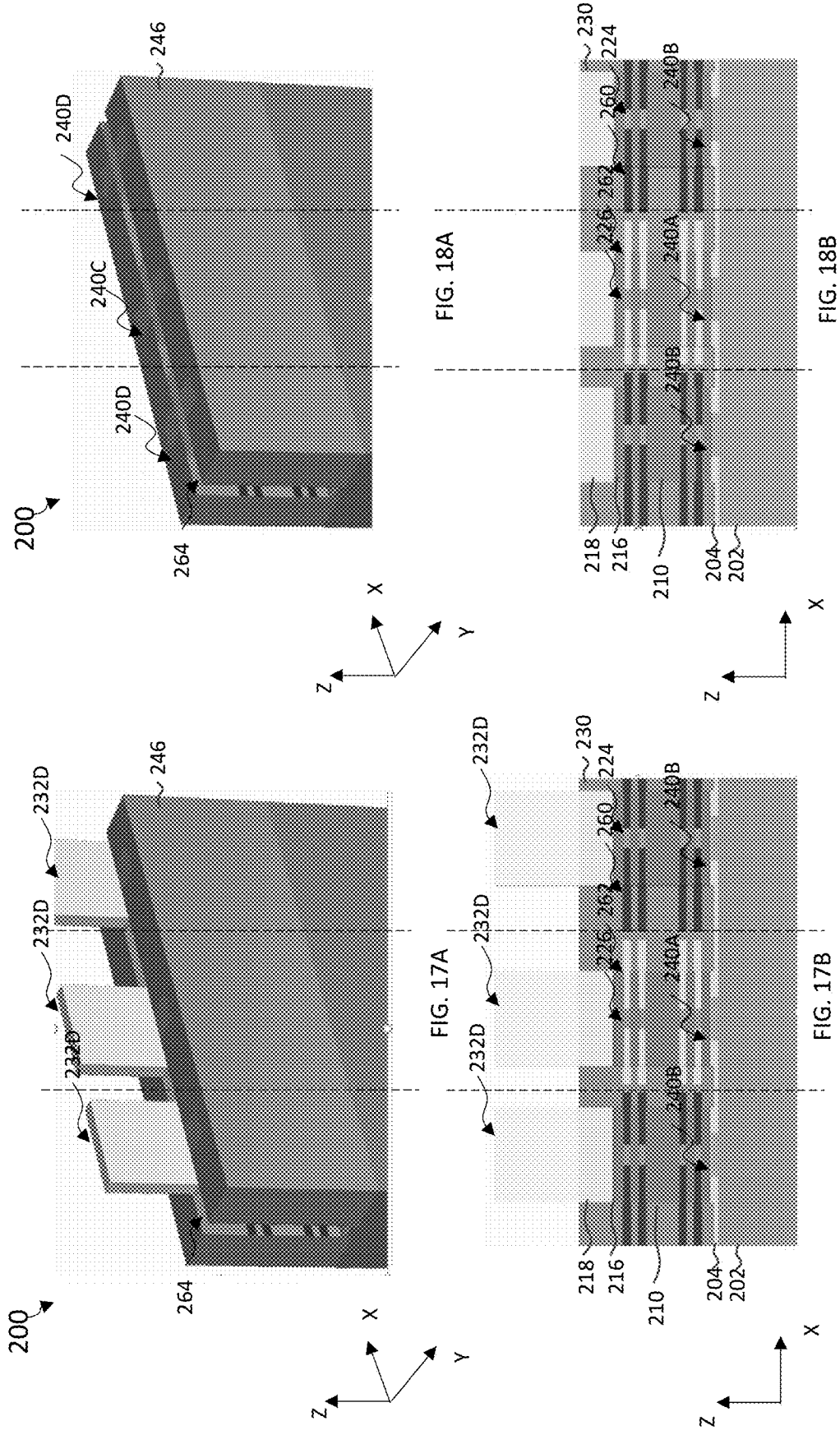

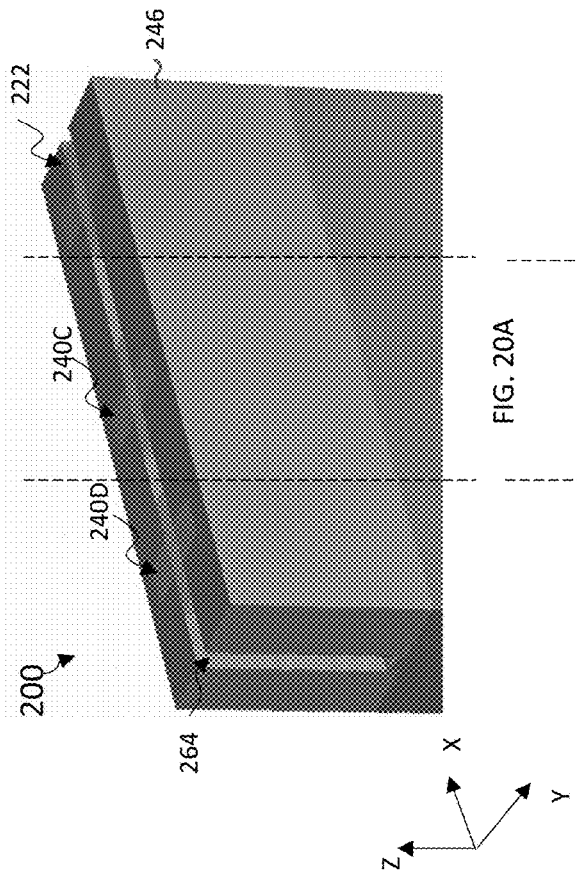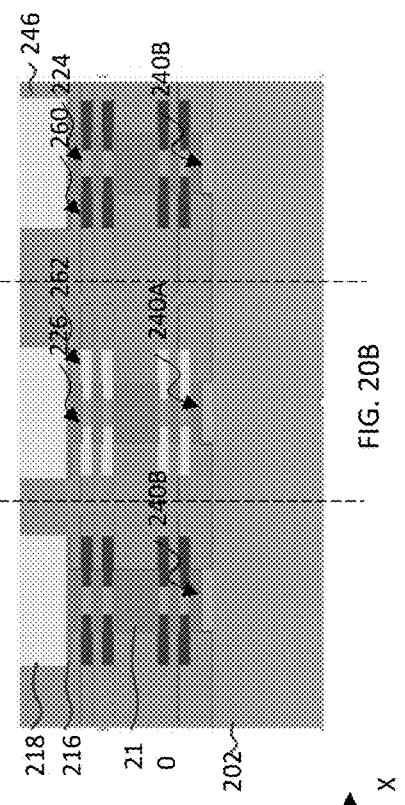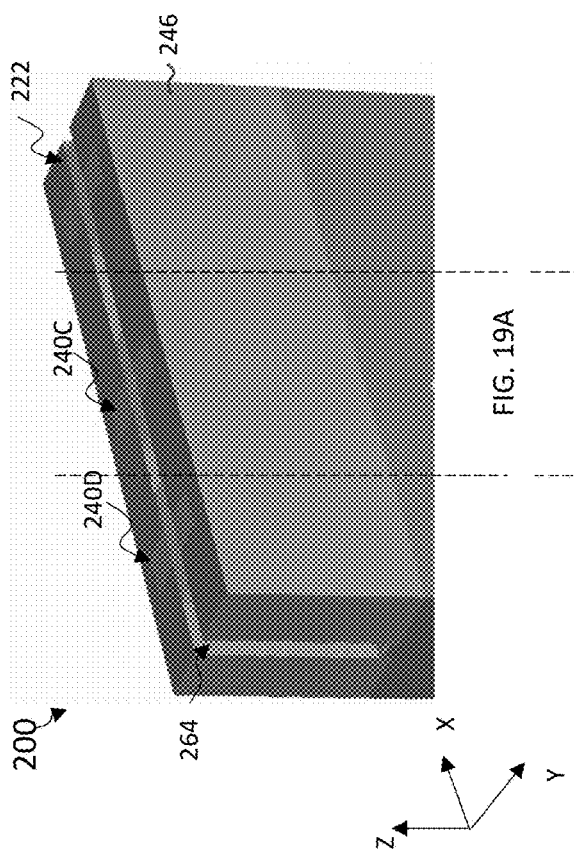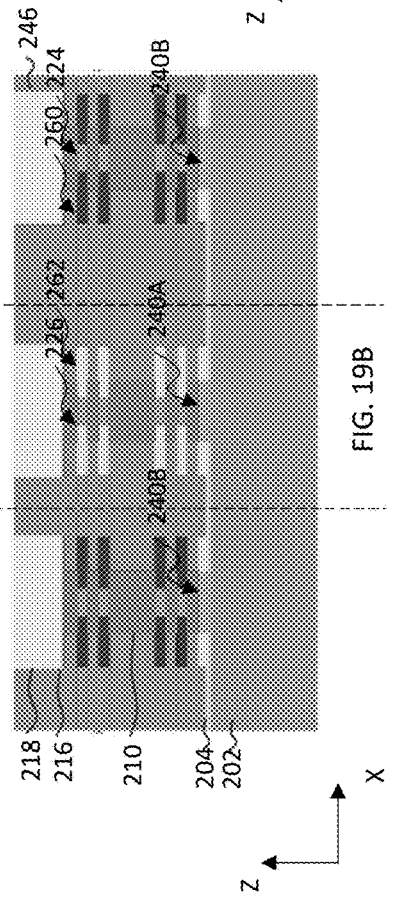
FIG. 19A
FIG. 19B
FIG. 20A
FIG. 20B

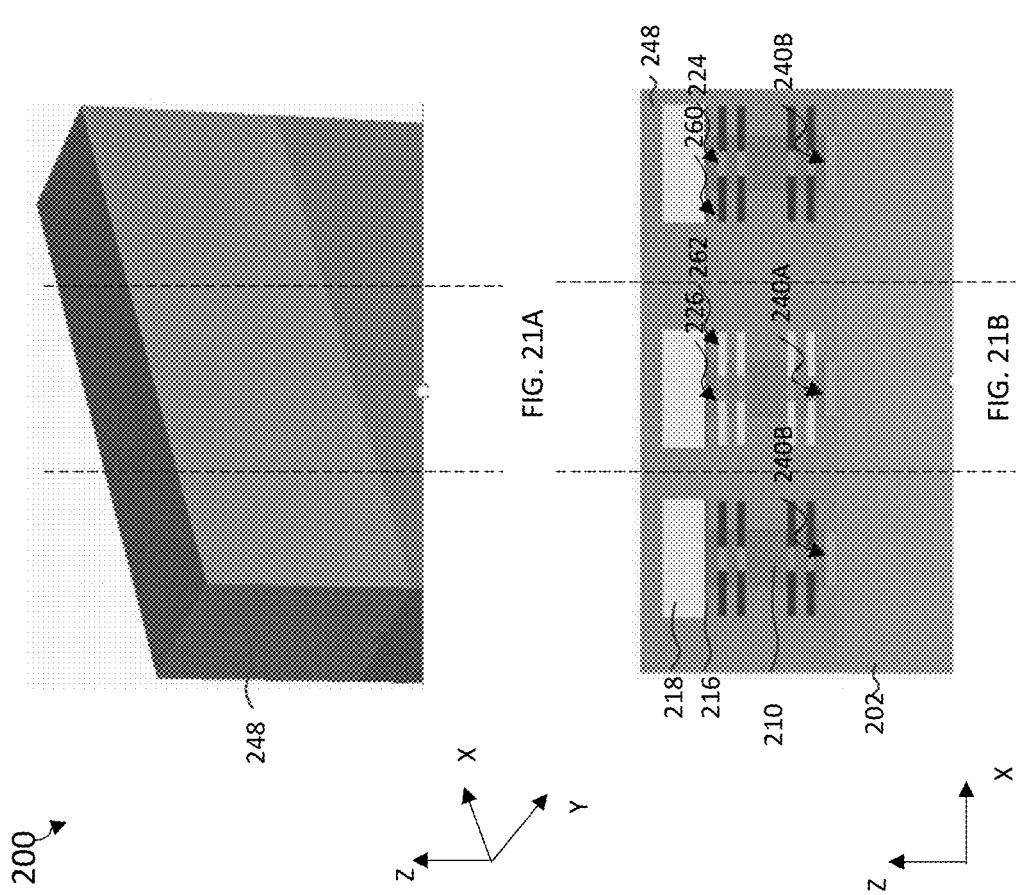

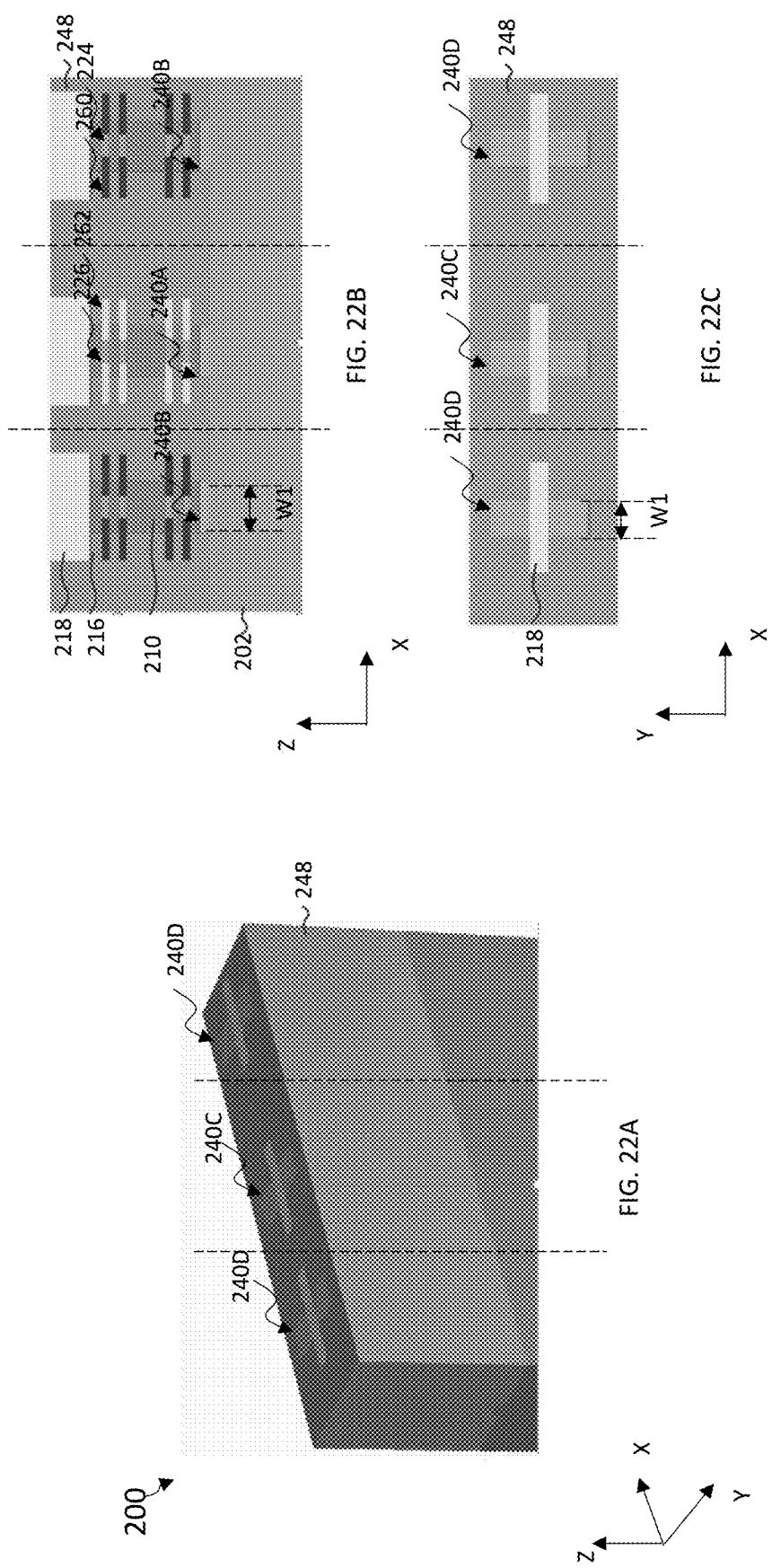

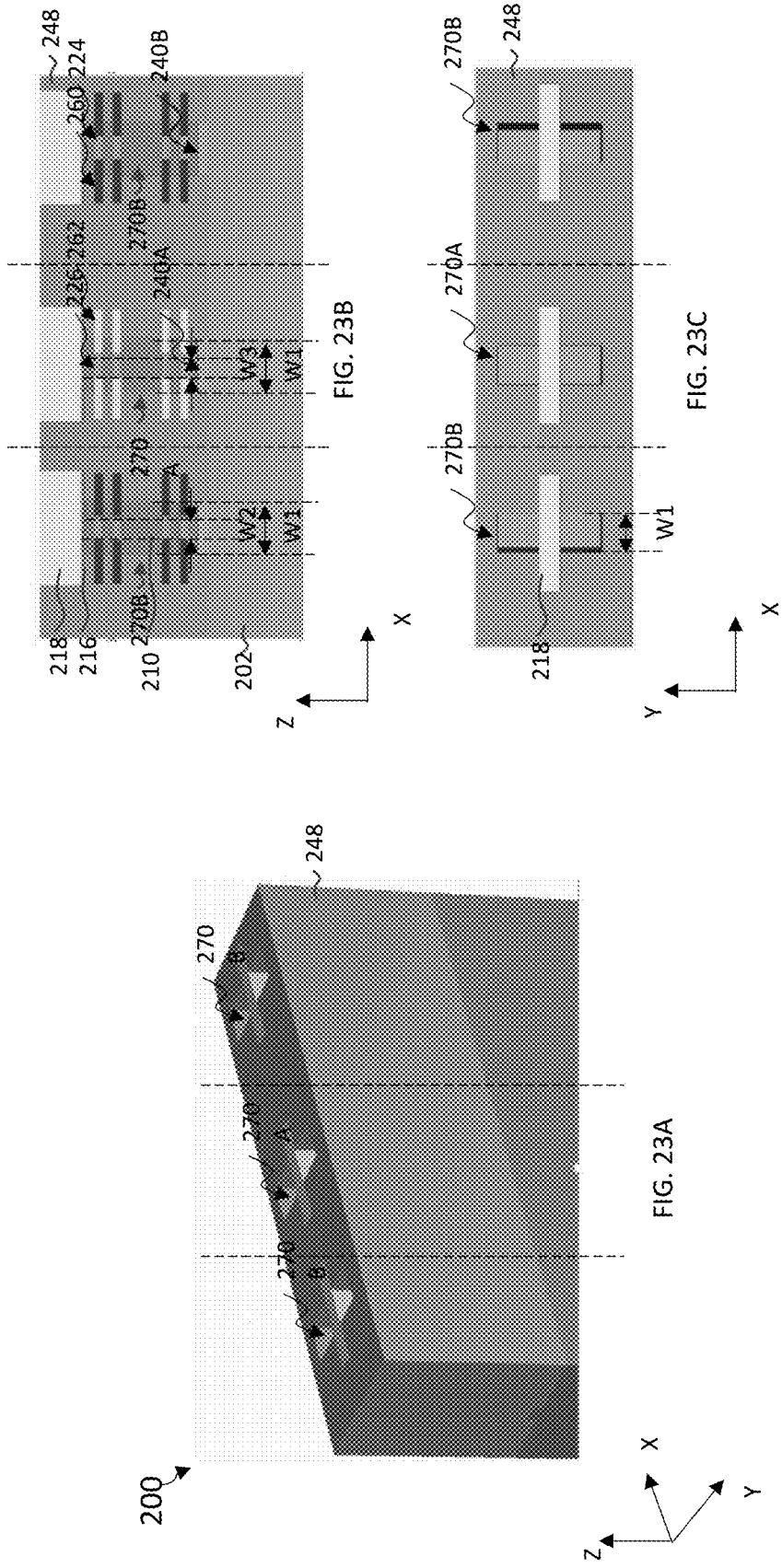

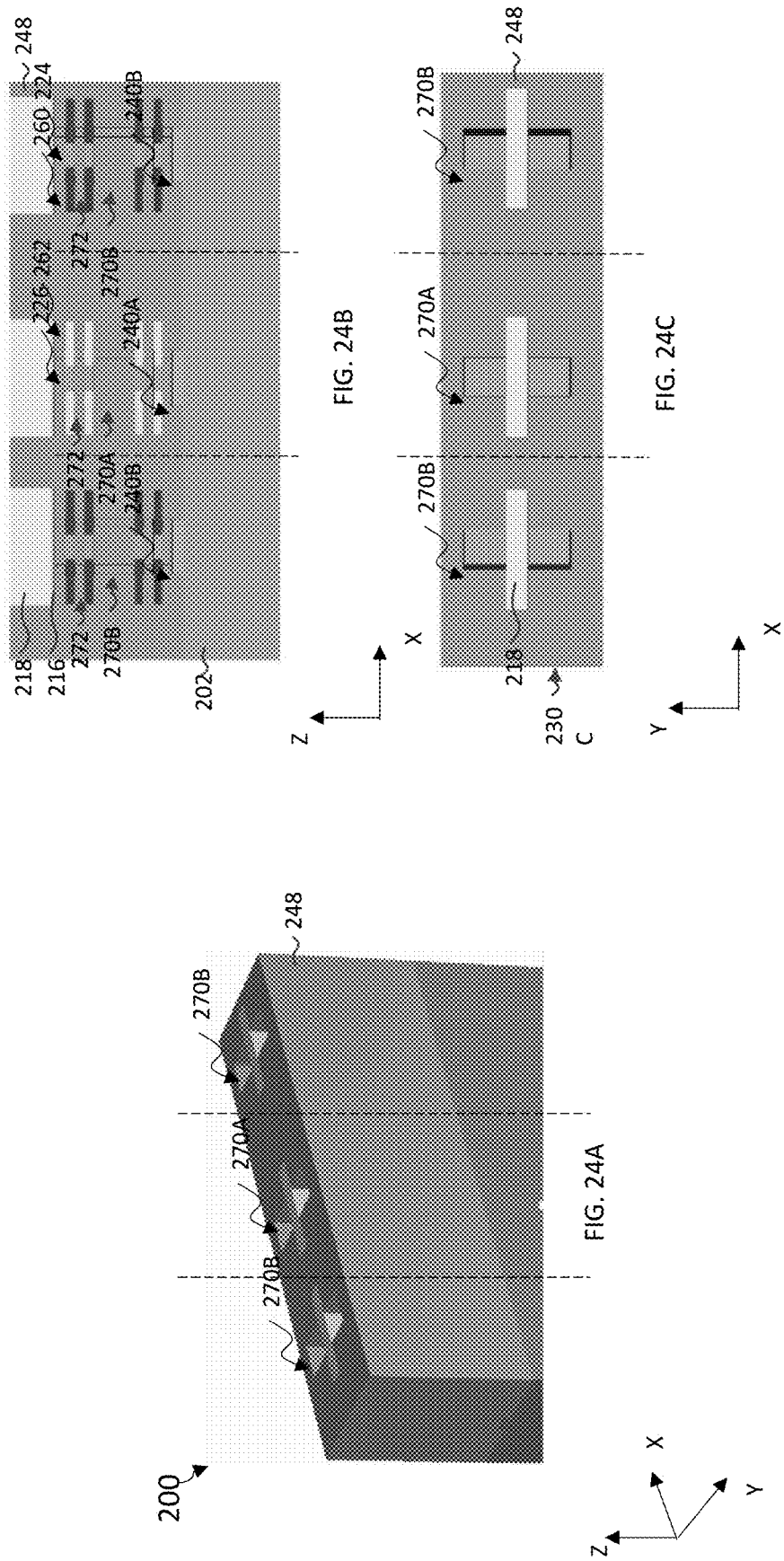

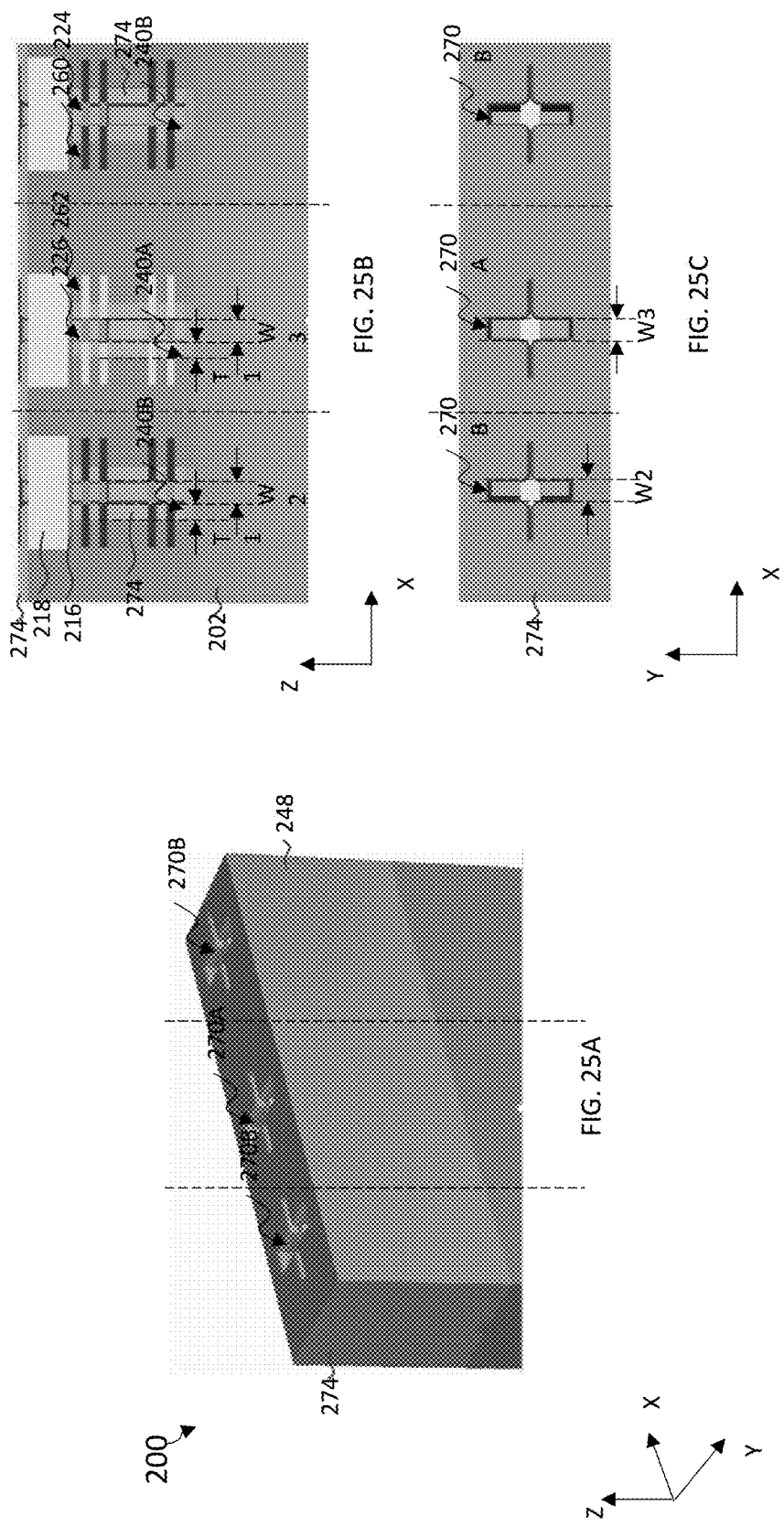

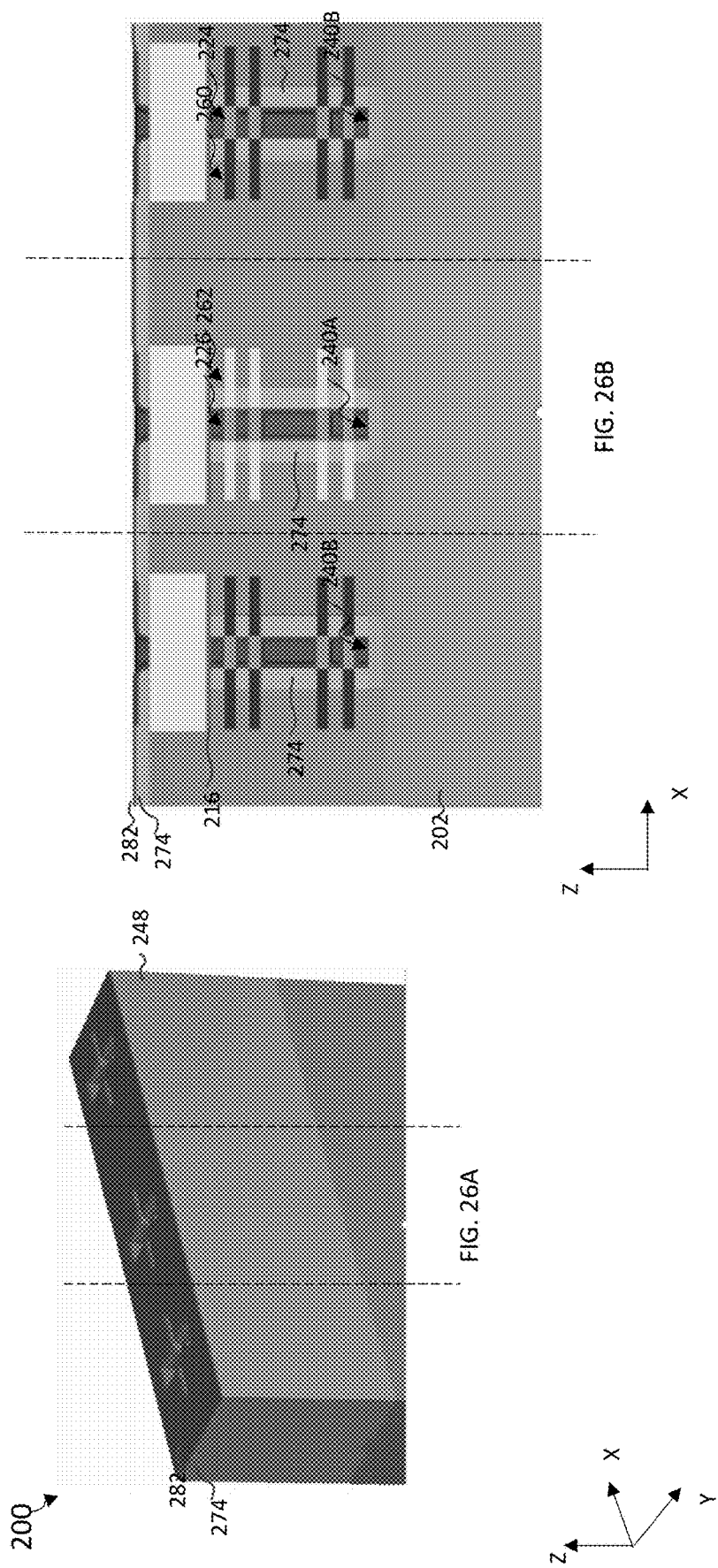

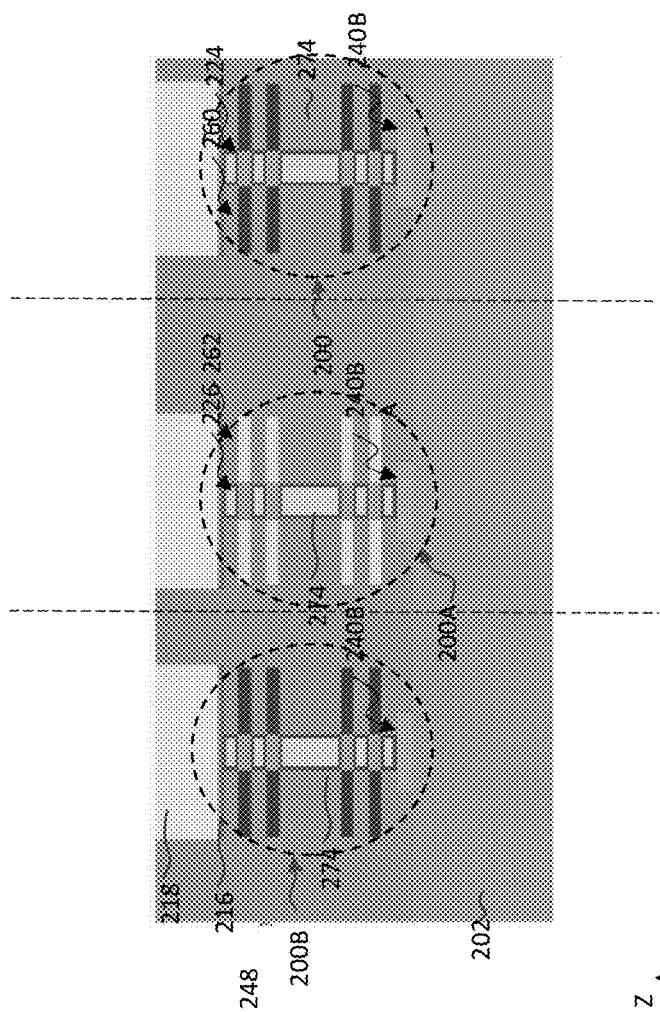

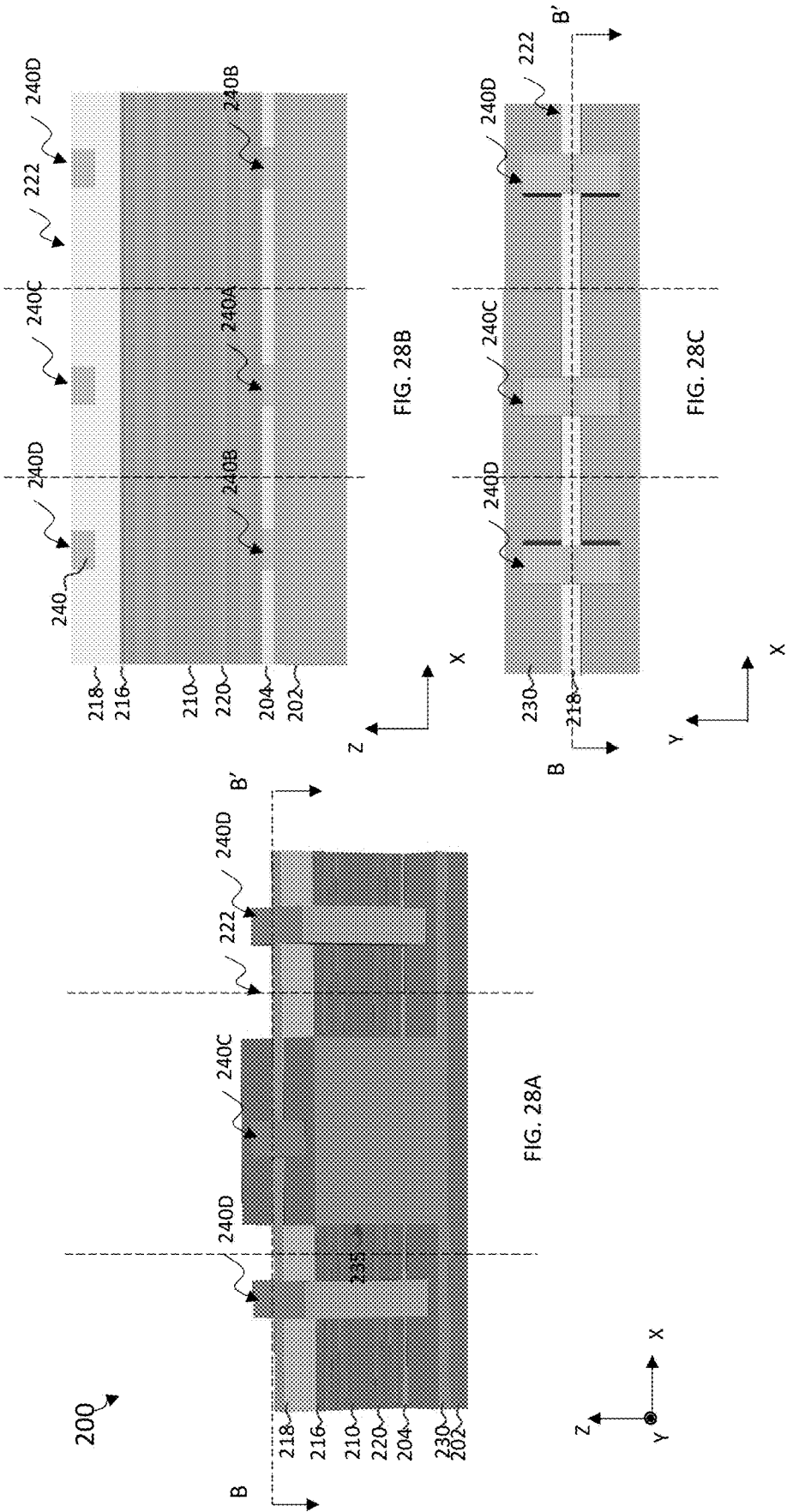

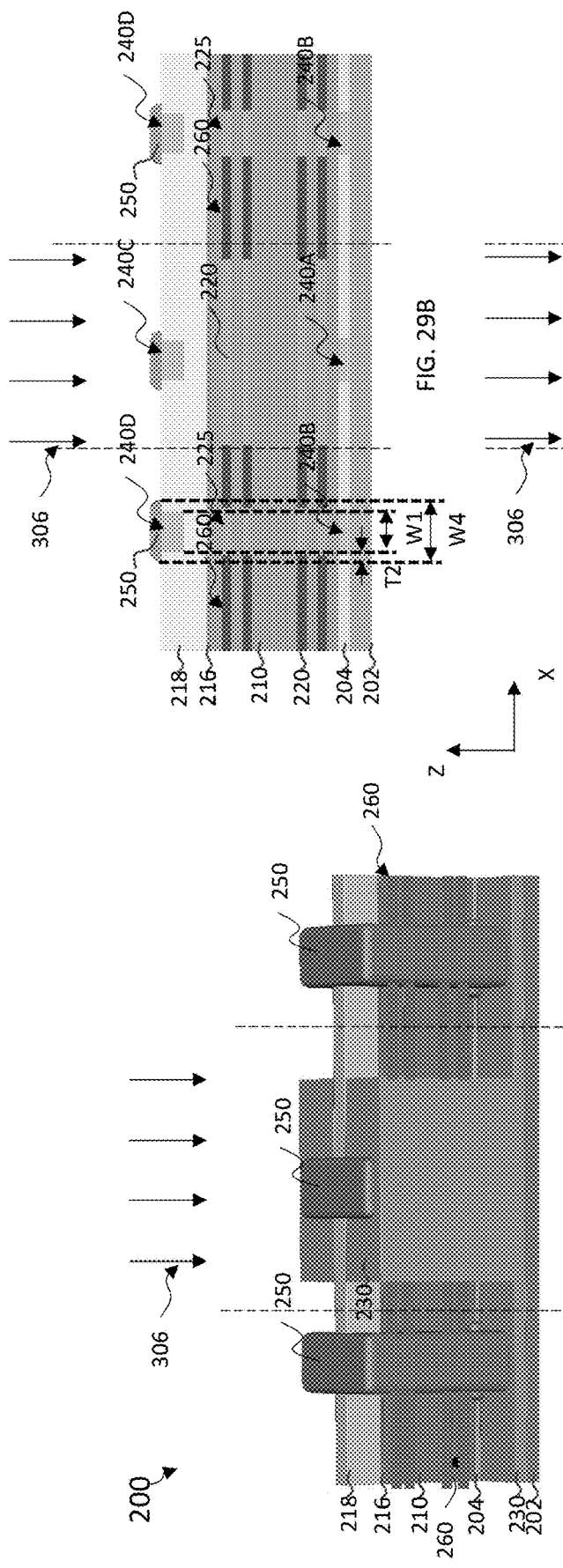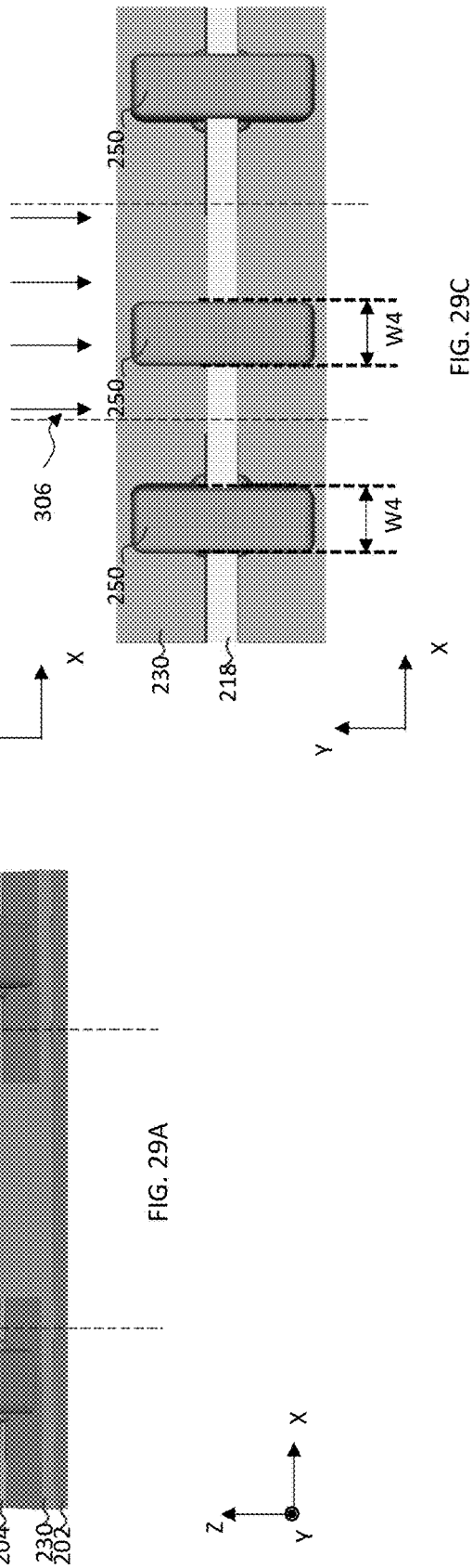

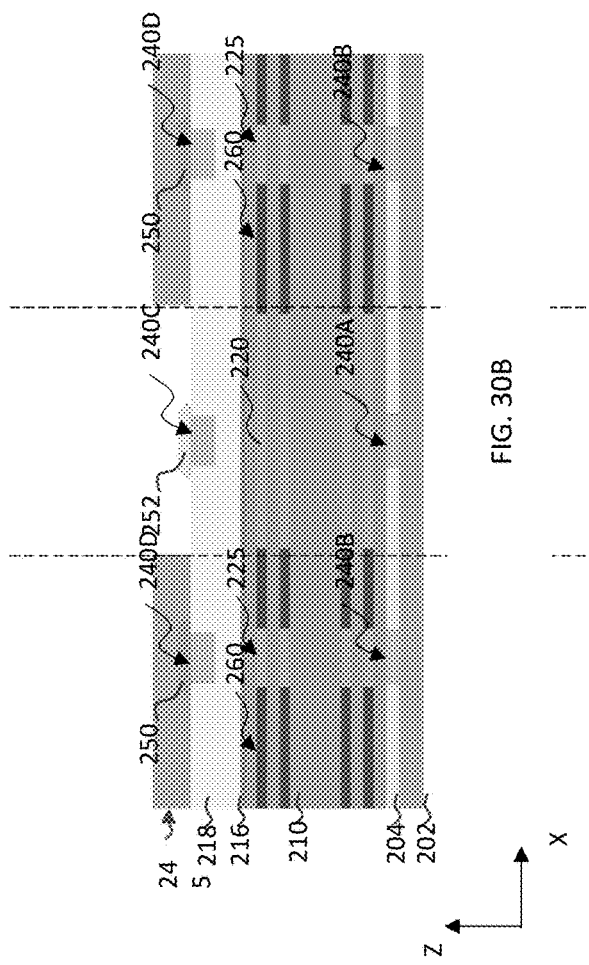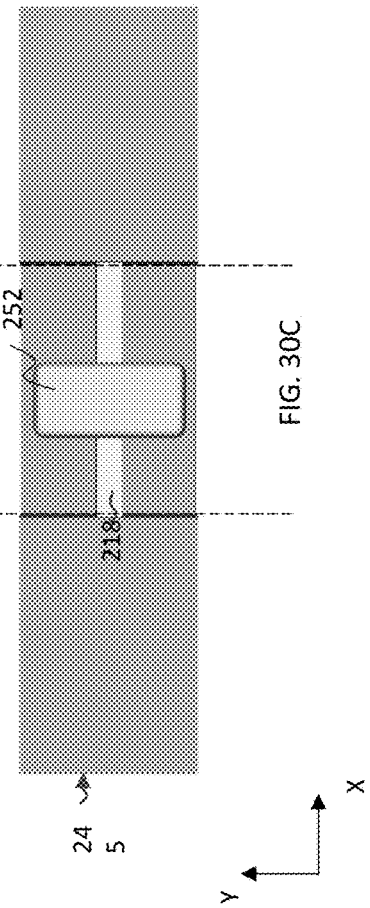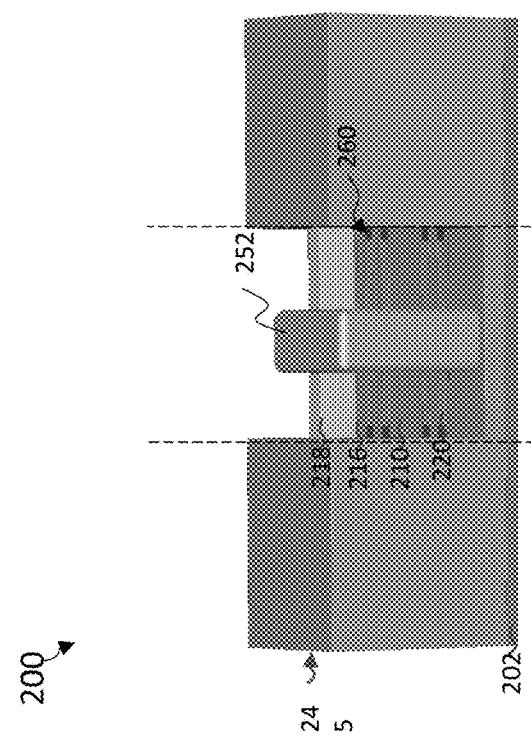

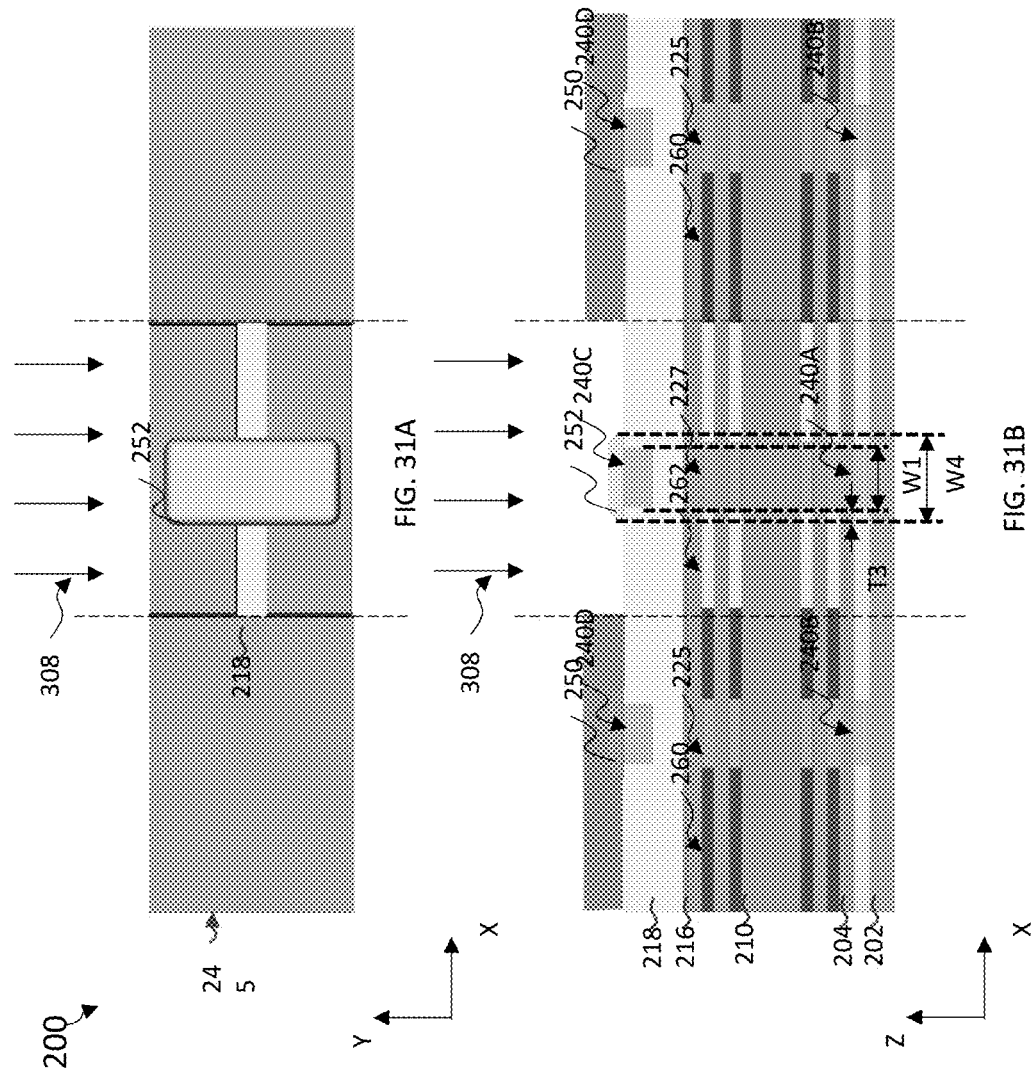

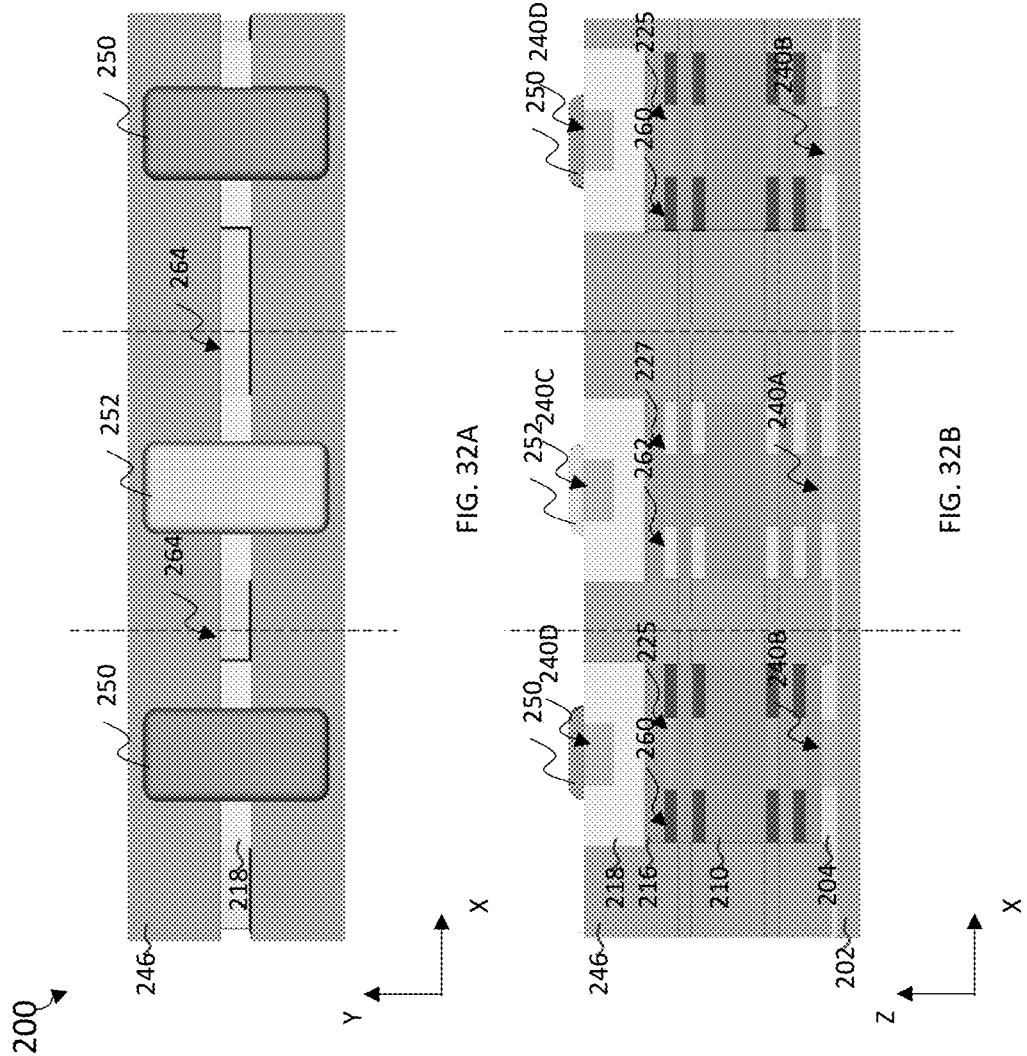

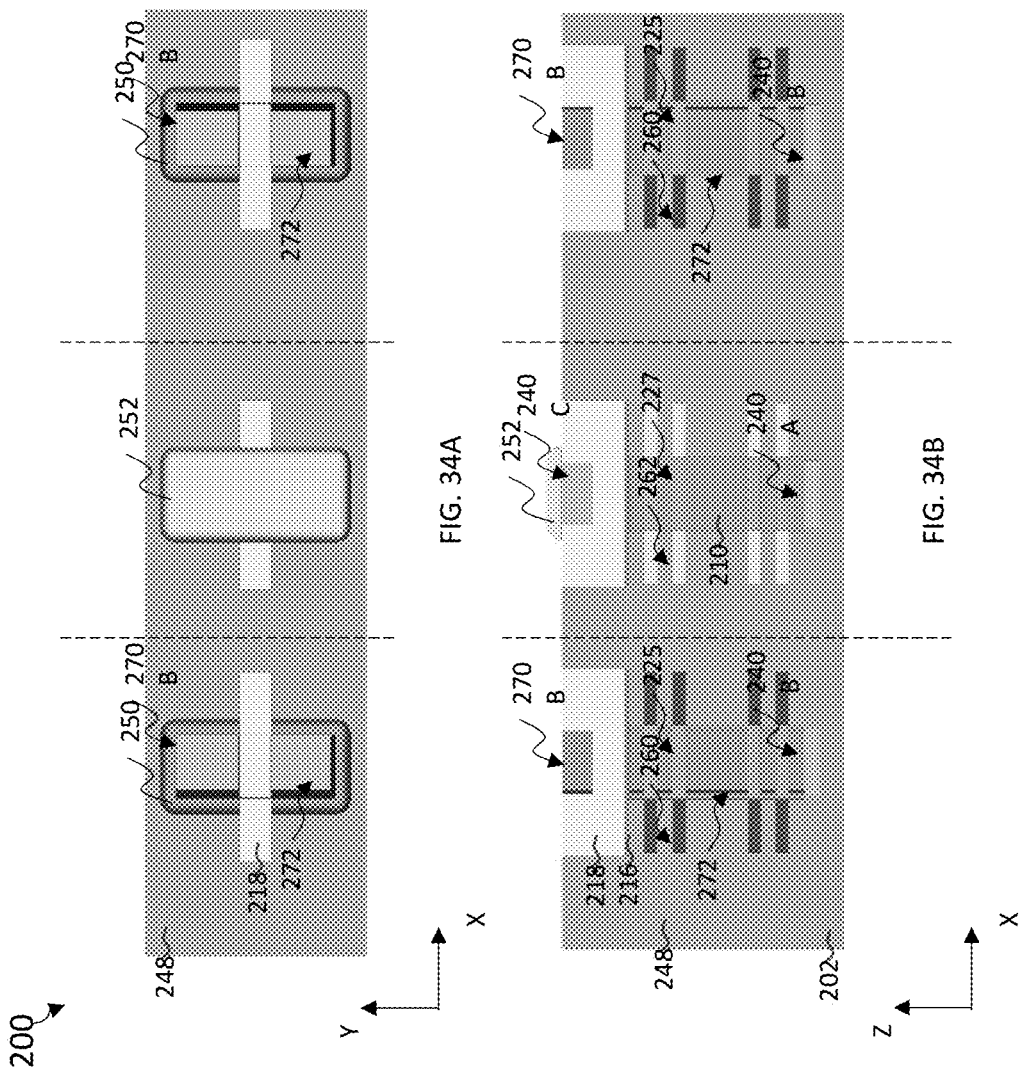

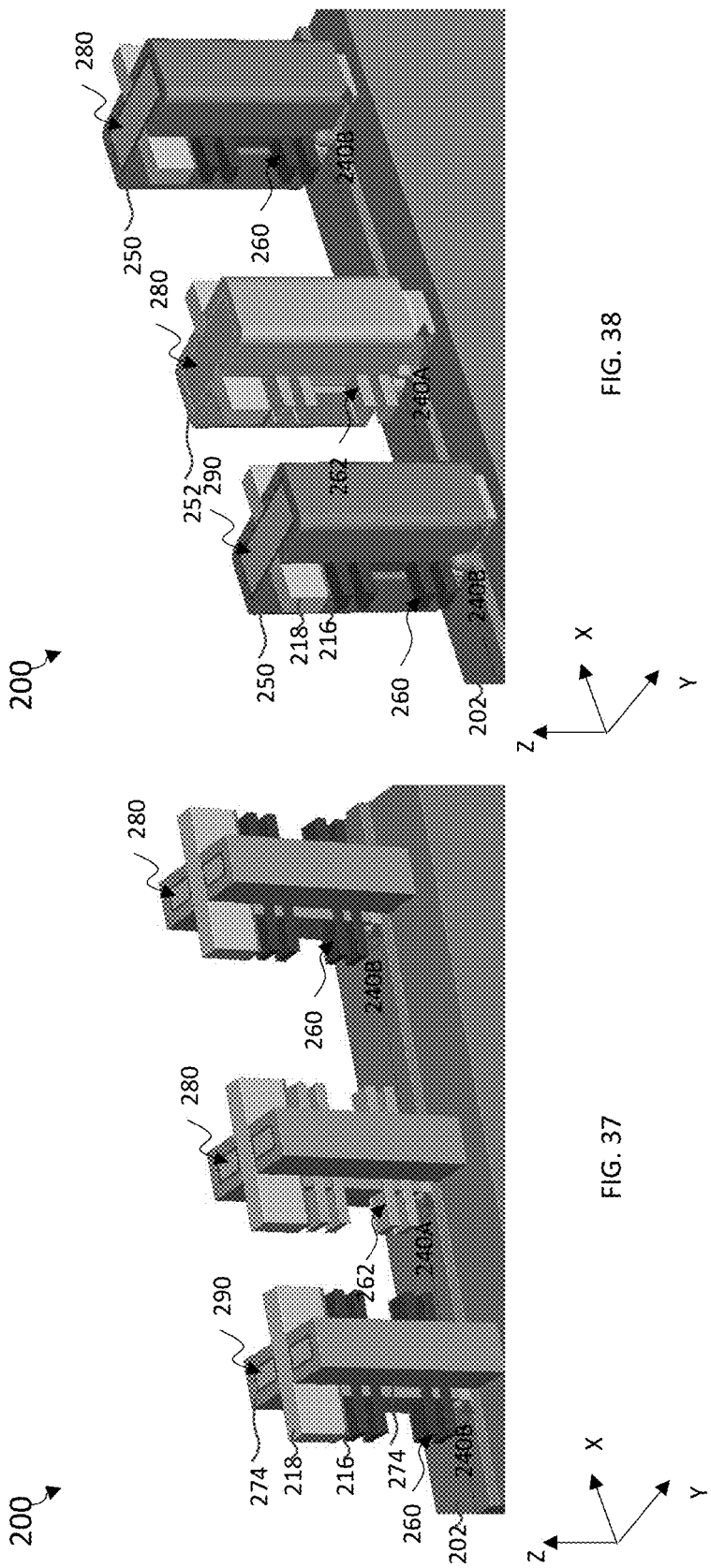

SEMICONDUCTOR DEVICES AND METHODS OF MANUFACTURING THEREOF

FILED OF THE DISCLOSURE

This disclosure relates generally to a semiconductor device, and in some embodiments, to a nanosheet transistor device that includes an inner gate spacer.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, forming gate isolation structures (e.g., gate spacers) in field-effect transistors becomes more challenging when device sizes continue to decrease. Although methods for addressing such a challenge have been generally adequate, they have not been entirely satisfactory in all aspects.

SUMMARY

The present disclosure provides various embodiments for forming gate spacers, such as inner gate spacer and/or outer gate spacer, in nanosheet transistor devices.

One embodiment may include a method that includes forming a fin structure over a substrate, the fin structure including alternating first semiconductor layers and second semiconductor layers stacked along a vertical direction. The method includes forming a dummy gate structure over the fin structure. The method includes depositing an outer spacer layer over the dummy gate structure. The method includes performing a plasma doping process to form source/drain regions in each second semiconductor layer adjacent the dummy gate structure along a lateral direction, where a portion of each second semiconductor layer interposing between the source/drain regions defines a channel region. The method includes forming a dielectric layer over the fin structure. The method includes removing the dummy gate structure to form a gate trench in the dielectric layer. The method includes selectively removing the first semiconductor layers to form openings interleaved with the second semiconductor layers. The method includes forming a metal gate structure to fill the gate trench and the openings.

Another embodiment may include a method that includes forming a fin structure over a substrate, the fin structure having a sacrificial layer and alternating first semiconductor layers and second semiconductor layers stacked along a vertical direction over the sacrificial layer. The method includes selectively removing portions of the sacrificial layer to form recesses. The method includes depositing a dielectric material over the substrate to form a dummy gate structure over the fin structure and to form a first dielectric layer in the recesses. The method includes depositing an outer spacer layer on the dummy gate structure. The method includes performing a plasma doping process to form source/drain regions in each second semiconductor layer, thereby defining a channel region interposed between the source/drain regions. The method includes forming a second dielectric layer over the dummy gate structure and the source/drain regions. The method includes removing the dummy gate structure to form a first opening in the second dielectric layer. The method includes removing the first semiconductor layers to form second openings interleaved with the second semiconductor layers. The method includes forming a metal gate structure over the inner spacer layer to fill the first and the second openings.

Yet another embodiment may include a method that includes forming a fin structure over a substrate, the fin structure including alternating silicon germanium (SiGe) layers and silicon (Si) layers stacked along a vertical direction. The method includes forming a dummy gate structure over the fin structure. The method includes depositing an outer spacer layer on the dummy gate structure. The method includes performing a plasma doping process to form source/drain regions in each Si layer adjacent the dummy gate structure along a lateral direction, where a portion of each Si layer interposing between the source/drain regions defines a channel region, and where the outer spacer layer overlaps with a portion of the source/drain regions along the lateral direction. The method includes forming a dielectric layer over the fin structure. The method includes removing the dummy gate structure to form a gate trench in the dielectric layer. The method includes selectively removing the SiGe layers to form openings interleaved with the Si layers along the vertical direction. The method includes forming a metal gate structure over the inner spacer layer to fill the gate trench and the openings.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 37, and 38 illustrate perspective views of an example semiconductor device, during intermediate stages of the method of FIGS. 1A-1C and/or 2, in accordance with some embodiments.

FIGS. 3B, 4B, 5B, 6B, 7B, 8B, 9B, 9C, 10B, 11B, 12B, 13B, 14B, 15B, 16B, 17B, 18B, 19B, 20B, 21B, 22B, 23B, 24B, 25B, 26B, 27B, 28B, 29B, and 30B illustrate cross-sectional views along line BB' of the example semiconductor device corresponding to FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively, during intermediate stages of the method of FIGS. 1A-1C and/or 2, in accordance with some embodiments.

FIGS. 22C, 23C, 24C, 25C, 28C, 29C, and 30C illustrate planar top views of the example semiconductor device corresponding to FIGS. 22A, 23A, 24A, 25A, 28A, 29A, and 30A, respectively, during intermediate stages of the method of FIGS. 1A-1C and/or 2, in accordance with some embodiments.

FIGS. 31A, 32A, 33A, 34A, 35A, and 36A illustrate planar top views of an example semiconductor device during intermediate stages of the method of FIGS. 1A-1C and/or 2, in accordance with some embodiments.

FIGS. 31B, 32B, 33B, 34B, 35B, and 36B illustrate cross-sectional views along line BB' of the example semiconductor device corresponding to FIGS. 31A, 32A, 33A, 34A, 35A, and 36A, respectively, during intermediate stages of the method of FIGS. 1A-1C and/or 2, in accordance with some embodiments.

DETAILED DESCRIPTION

Figure 1A:
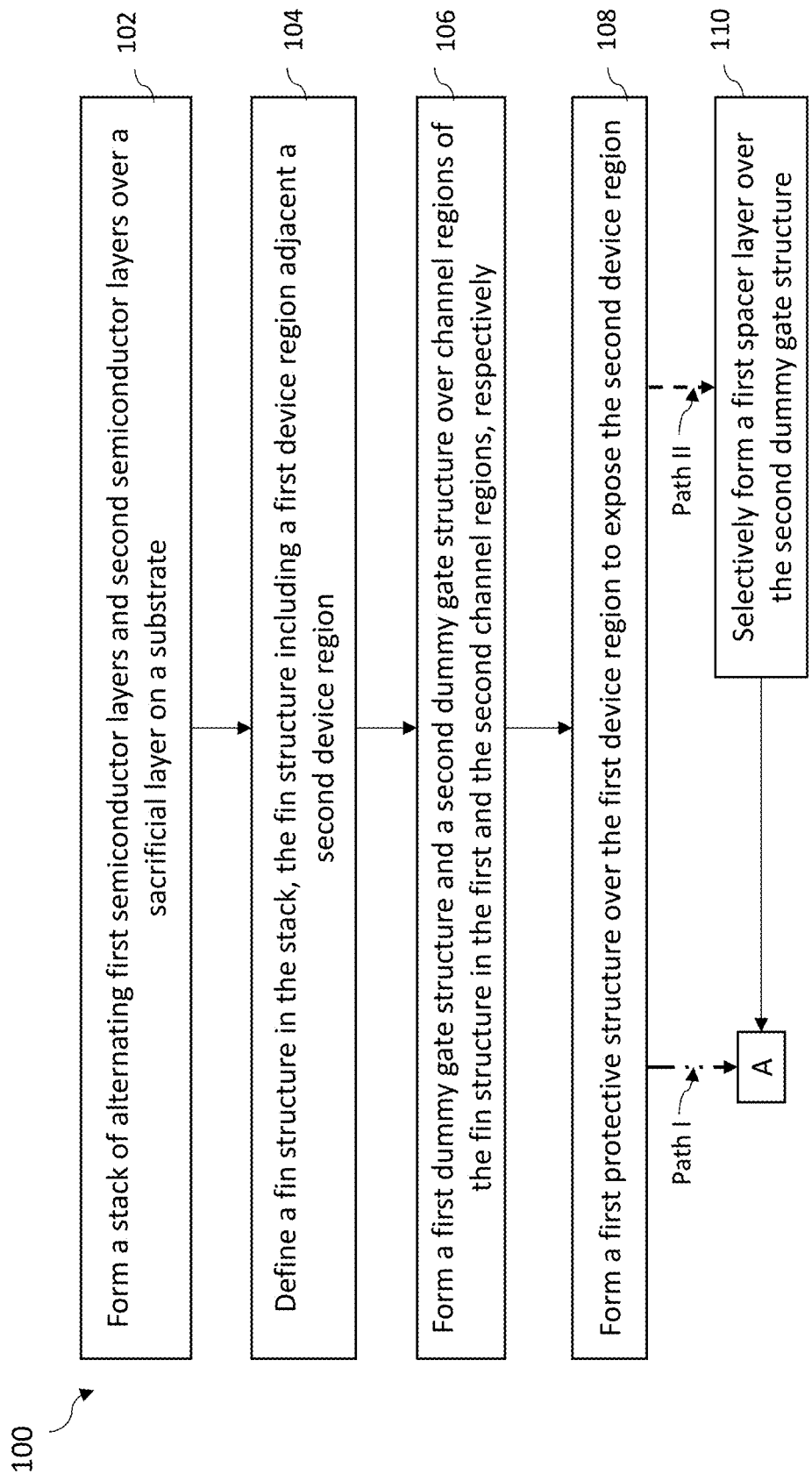
FIGS. 1A-1C collectively illustrate a flow chart of an example method to make an example semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), and/or other traits. Such a transistor that has a gate structure fully wrapping around its channel may sometimes be referred to as a gate-all-around (GAA) transistor.

Figure 1B:
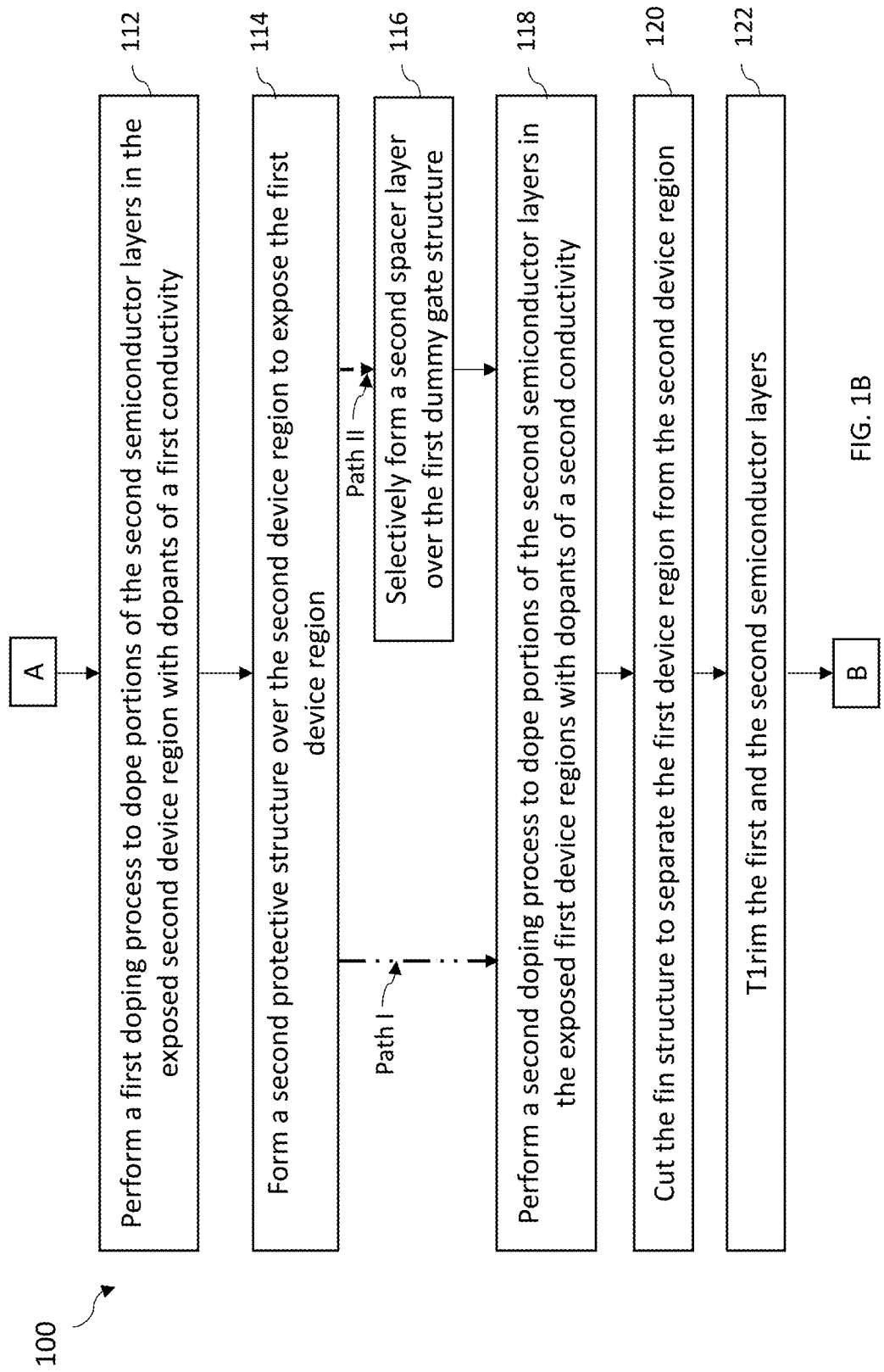
Figure 1C:
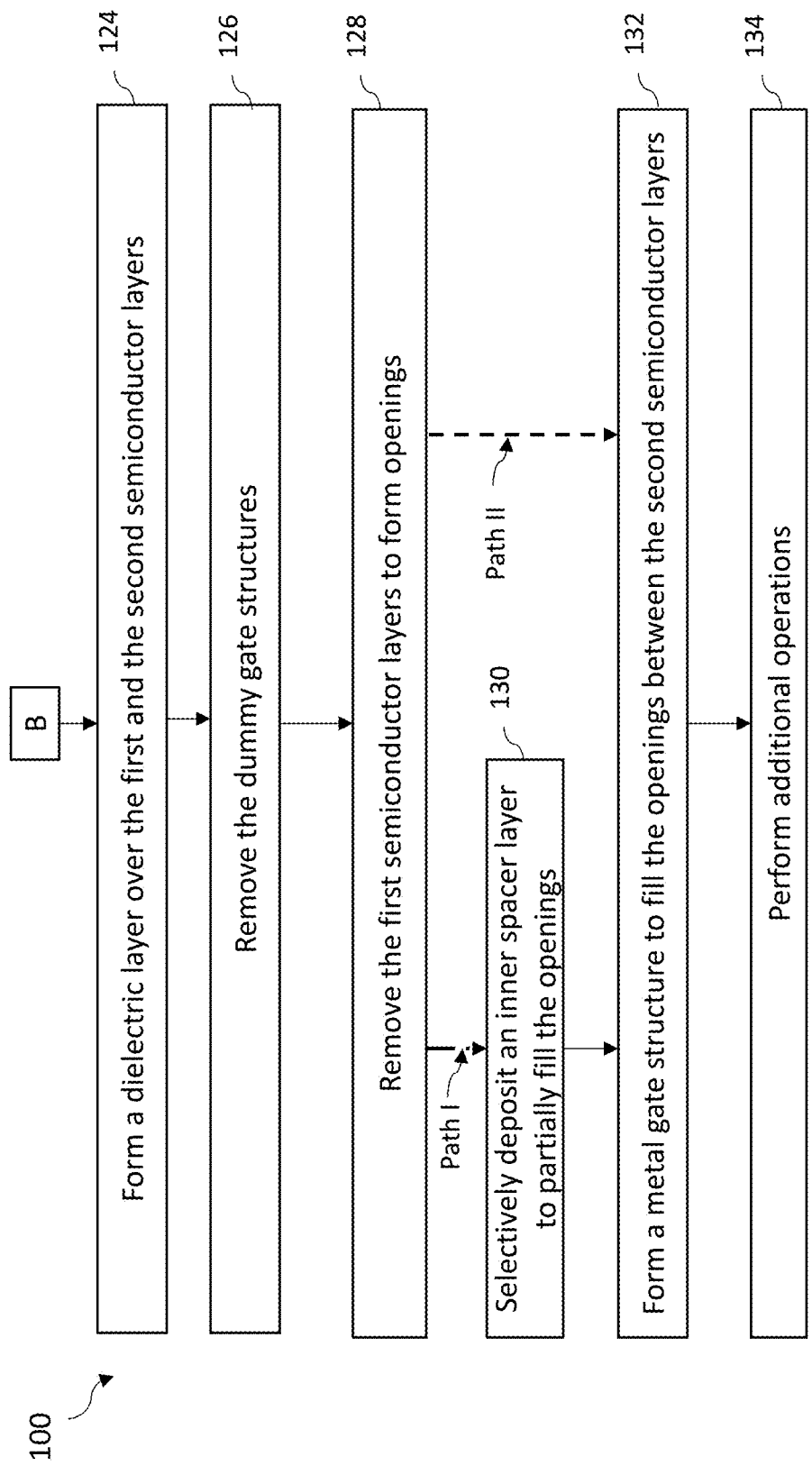

FIGS. 1A-1C collectively illustrate a flowchart of a method 100 to form a non-planar transistor device, according to one or more embodiments of the present disclosure. At least some of the operations (or steps) of the method 100 can be used to form a non-planar transistor device such as, for example, a nanosheet transistor device, a nanowire transistor device, a vertical transistor device, or the like. In some embodiments, the method 100 can be used to form a transistor device 200 in a respective conduction type such as, for example, an N-type transistor device or a P-type transistor device. In some embodiments, the method 100 can be used to form a complementary device including at least one N-type transistor device and at least one P-type transistor device. The term "N-type," as used herein, may be referred to as the conduction type of a transistor device having electrons as its conduction carriers; and the term "P-type," as used herein, may be referred to as the conduction type of a transistor device having holes as its conduction carriers. Although FIGS. 3A-45 illustrate the transistor device 200 to be a nanosheet (or nanowire) transistor device, it is understood the transistor device 200 may include a number of other devices such as inductors, fuses, capacitors, coils, etc., which are not shown in FIGS. 3A-45, for purposes of clarity of illustration.

It is noted that the method 100 is merely an example, and is not intended to limit the present disclosure. Accordingly, it is understood that additional operations may be provided before, during, and after the method 100 of FIGS. 1A-2C, and that some other operations may only be briefly described herein.

In various embodiments, some operations of the method 100 as shown in FIGS. 1A-1C may be associated with three-dimensional perspective views of an example transistor device at various fabrication stages as shown in FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 37, and 38. For purposes of clarity, FIGS. 3B, 4B, 5B, 6B, 7B, 8B, 9B, 9C, 10B, 11B, 12B, 13B, 14B, 15B, 16B, 17B, 18B, 19B, 20B, 21B, 22B, 23B, 24B, 25B, 26B, 27B, 28B, 29B, and 30B, provide cross-sectional views along line BB' of the example transistor device corresponding to FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, and 30A, respectively. In the depicted embodiments, the line BB' corresponds to a cut along the longitudinal (or lengthwise) direction of a plurality of nanosheets (or nanowires, for example), i.e., generally perpendicular to a longitudinal direction of a gate trench or active gate structure.

In various embodiments, some operations of the method 100 as shown in FIGS. 1A-1C may be associated with planar top views of the example transistor device at various fabrication stages are provided in FIGS. 22C, 23C, 24C, 25C, 28C, 29C, and 30C, corresponding to 22A, 23A, 24A, 25A, 28A, 29A, and 30A, respectively.

In various embodiments, some operations of the method 100 as shown in FIGS. 1A-1C may be associated with planar top views of the example transistor device at various fabrication stages as shown in FIGS. 31A, 32A, 33A, 34A, 35A, and 36A, and corresponding cross-sectional view along the line BB' as shown in FIGS. 31B, 32B, 33B, 34B, 35B, and 36B, respectively.

Referring to FIGS. 1A and 3A-3B, the method 100 at operation 102 forms a stack of semiconductor layers protruding from a semiconductor substrate 202. In the present embodiments, the stack includes a number of first semiconductor layers 210 and second semiconductor layers 220 over a sacrificial layer 204, where the first semiconductor layers 210 and the second semiconductor layers 220 are interleaved to form the stack.

The semiconductor substrate 202 includes a semiconductor material substrate, for example, silicon. Alternatively, the semiconductor substrate 202 may include other elementary semiconductor material such as, for example, germanium. The semiconductor substrate 202 may also include a compound semiconductor such as silicon carbide, gallium arsenic, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the semiconductor substrate 202 may have an epitaxial layer overlying a bulk semiconductor. Furthermore, the semiconductor substrate 202 may include a semiconductor-on-insulator (SOI) structure. For example, the semiconductor substrate 202 may include a buried oxide (BOX) layer formed by a process such as separation by implanted oxygen (SIMOX) or other suitable technique, such as wafer bonding and grinding.

The first semiconductor layers 210 and the second semiconductor layers 220 (collectively referred to as the semiconductor layers 210 and 220) are alternately disposed on top of one another (e.g., along the Z direction) to form the stack. For example, one of the second semiconductor layers 220 is disposed over one of the first semiconductor layers 210 then another one of the first semiconductor layers 210 is disposed over the second semiconductor layer 220, so on and so forth.

The stack may include any number of alternately disposed semiconductor layers 210 and 220. The semiconductor layers 210 and 220 may have different thicknesses. The first semiconductor layers 210 may have different thicknesses from one layer to another layer. The second semiconductor layers 220 may have different thicknesses from one layer to another layer. The thickness of each of the semiconductor layers 210 and 220 may range from few nanometers to few tens of nanometers.

In the present embodiments, the semiconductor layers 210 and 220 have different compositions. In some embodiments, the two semiconductor layers 210 and 220 have compositions that provide for different oxidation rates and/or different etch selectivity between the layers. In some embodiments, the first semiconductor layers 210 include silicon germanium ($Si_{1-x}Ge_x$), and the second semiconductor layers 220 include silicon (Si). In some embodiments, each of the second semiconductor layers 220 includes silicon that may be undoped or substantially dopant-free (i.e., having an extrinsic dopant concentration from about 0 cm$^{-3}$ to about $1 \times 10^{17}$ cm$^{-3}$), where, for example, no intentional doping is performed when forming the second semiconductor layers 220 (e.g., of silicon).

The sacrificial layer 204 is formed between the semiconductor substrate 202 and the stack of the semiconductor layers 210 and 220. The sacrificial layer 204 includes a semiconductor material different from both the first semiconductor layers 210 and the second semiconductor layers 220 and is configured to be replaced, at least partially, with a dielectric layer (e.g., a dielectric layer 240) in subsequent operations. In some embodiments, the sacrificial layer 204 includes silicon germanium ($Si_{1-y}Ge_y$), where y is different from x. For example, x may be about 35% and y may be about 65%.

One or both of the semiconductor layers 210 and 220 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 210 and 220 may be chosen based on their relative oxidation rates and/or etching selectivity.

The method 100 at operation 102 may form the sacrificial layer 204 and the semiconductor layers 210 and 220 by one or more epitaxial growth processes from the semiconductor substrate 202. For example, each of the sacrificial layer 204 and the semiconductor layers 210 and 220 may be grown by a molecular beam epitaxy (MBE) process, a chemical vapor deposition (CVD) process such as a metal organic CVD (MOCVD) process, other suitable epitaxial growth processes, or combinations thereof. During the epitaxial growth process, the crystal structure of the semiconductor substrate 202 extends upwardly, resulting in the sacrificial layer 204 and the semiconductor layers 210 and 220 having the same crystal orientation with the semiconductor substrate 202.

Subsequently, the method 100 may form a mask layer over the stack of the semiconductor layers 210 and 220 to protect the underlying layers from being damaged during subsequent operation. In some embodiments, the mask layer include multiple layers such as, for example, a first hard mask layer 216 and an overlying second hard mask 218. The first hard mask layer 216 may be a thin film comprising silicon oxide formed, for example, using a thermal oxidation process. The first hard mask layer 216 may act as an adhesion layer between the topmost first semiconductor layer 210 (or the topmost second semiconductor layer 220 in some other embodiments) and the second hard mask 218. In some embodiments, the second hard mask 218 is formed of silicon nitride, silicon oxynitride, silicon carbonitride, the like, or combinations thereof. The first hard mask layer 216 and the second hard mask 218 may each be formed using CVD, atomic layer deposition (ALD), low-pressure chemical vapor deposition (LPCVD), or plasma enhanced chemical vapor deposition (PECVD), or other suitable methods.

Referring to FIGS. 1A and 4A-4B, the method 100 at operation 104 defines a fin structure 222 in the sacrificial layer 204 and the stack of the semiconductor layers 210 and 220. Although one fin structure 222 is shown in the present depiction for purpose of simplicity, it should be appreciated that the transistor device 200 can include any number of fin structures while remaining within the scope of the present disclosure, where the fin structures may be arranged in a parallel configuration and spaced from each along the Y direction. The fin structure 222, which is elongated along a lateral direction (e.g., the X direction), can include a stack of semiconductor layers 210 and 220 interleaved with each other.

The fin structure 222 may be formed by patterning the semiconductor layers 210 and 220 and the sacrificial layer 204 using, for example, photolithography and etching techniques. For example, the mask layer that includes the first hard mask layer 216 and the second hard mask 218 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the first hard mask layer 216 and second hard mask 218 to form a patterned mask (not shown).

The patterned mask is subsequently used to pattern exposed portions of the semiconductor layers 210 and 220 and the semiconductor substrate 202 to form trenches (or openings; not shown), thereby defining the fin structure 222 between adjacent trenches. When multiple fin structures 222 are formed, such a trench may be disposed between any adjacent ones of the fin structures. In some embodiments, the fin structure 222 is formed by etching trenches in the semiconductor layers 210 and 220 and the semiconductor substrate 202 using, for example, dry etch, wet etch, reactive ion etch (RIE), neutral beam etch (NBE), the like, or combinations thereof. The etching process may be anisotropic. In some embodiments, the trenches may be strips (when viewed from the top) parallel to each other, and closely spaced with respect to each other. In some embodiments, the trenches may be continuous and surround the fin structure 222. After patterning the mask layer, the photoresist material is removed using any suitable method, such as plasma ashing or resist stripping.

In the present embodiments, the fin structure 222 includes a device region 202N adjacent a device region 202P configured to provide transistor devices of N-type and P-type, respectively. In some embodiments, the device regions 202N and 202P are arranged in an alternating configuration along the X direction, such that two adjacent transistor devices are formed to have different conductivity types, resulting in a complementary device. It is appreciated that other arrangements of the device regions 202N and 202P may also be applicable within the scope of the present disclosure. In an example embodiment provided by the subsequent operations of the method 100, the device regions 202N and 202P are configured to provide transistor devices of different conductivity types that are formed separately from one another. It is noted that the present disclosure does not limit the order in which such transistor devices are formed in the device regions 202N and 202P. For example, the method 100 may form the transistor device in the device region 202N first or, alternatively, the method 100 may form the transistor device in the device region 202P first.

In some embodiments, isolation structures (not shown) are formed around the fin structure 222 to separate it from adjacent fin structures 222. The isolation structures may be formed over the semiconductor substrate 202 and partially embed lower portions of the fin structures 222. The isolation structures may include an oxide, a nitride, a low-k dielectric material (e.g., having a dielectric constant of less than about 3.9), the like, or combinations thereof. The isolation structures may include silicon oxide, phosphosilicate glass (PSG), borosilicate glass (BSG), boron-doped phosphosilicate glass (BPSG), undoped silicate glass (USG), or the like, or combinations thereof. may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. The isolation structures may be formed by depositing an insulating (or dielectric) material around the fin structure 222, performing a planarization process (e.g., a chemical-mechanical polishing, or CMP, process), and subsequently recessing the insulation material to form the isolation structures. In this regard, the isolation structures may include a shallow-trench isolations (STIs).

Referring to FIGS. 1A and 5A-9C, the method 100 at operation 106 forms a dummy gate structure over the fin structure 222 in each of the device regions 202N and 202P.

In some embodiments, referring to FIGS. 5A-7B, the method 100 first forms and patterns a dielectric layer 230 around the fin structure 222. The dielectric layer 230 may include any suitable dielectric (or insulating) material, such as silicon oxide, silicon nitride, silicon oxynitride, silicon carbide, silicon carbonitride, silicon oxycarbonitride, silicon oxycarbide, the like, or combinations thereof. In the present embodiments, the dielectric layer 230 differs from the protect oxide layer 216 and the second hard mask 218 in composition to ensure sufficient etching selectivity therebetween. In some examples, the dielectric layer 230 may include silicon oxide. The dielectric layer 230 may be deposited over the semiconductor substrate 202 using any suitable method, such as CVD, FCVD, HDP-CVD, the like, or combinations thereof, and planarized using one or more CMP processes to expose the second hard mask 218 as shown in FIGS. 5A-5B.

Subsequently, referring to FIGS. 6A-6B, the dielectric layer 230 is patterned using a patterned photoresist layer 232A, which may be formed by a method similar to that discussed above with respect to forming the fin structure 222. The patterned photoresist layer 232A includes multiple openings corresponding to a position of the dummy gate structure in each device regions 202N and 202P. Referring to FIGS. 7A-7B, the dielectric layer 230 may then be etched using the patterned photoresist layer 232A as an etch mask to form openings 234A and 234B, corresponding to the dummy gate structures to be formed in the device region 202N and 202P, respectively. The etching process may be a dry etching process, an RIE process, a wet etching process, the like, or combinations thereof. The patterned photoresist layer 232A may then be removed by any suitable method as discussed above.

As shown in FIGS. 7A-7B, after forming the openings 234A and 234B, portions of the sacrificial layer 204 may be removed to form openings 236A and 236B at positions corresponding to the openings 234A and 234B, respectively, where the openings 236A and 236B extend longitudinally along the Y direction. In the present embodiments, a width W1 of the openings 234A and 234B measured along the X direction defines a width of each of the openings 236A and 236B.

Referring to FIGS. 8A-9C, a dielectric layer 240 is formed over the patterned dielectric layer 230, thereby filling the openings 234A, 234B, 236A, and 236B. The dielectric layer 240 may include any suitable dielectric material, such as silicon oxide, silicon nitride, silicon oxynitride, silicon carbide, silicon carbonitride, silicon oxycarbonitride, silicon oxycarbide, the like, or combinations thereof. In the present embodiments, the dielectric layer 240 differs from the dielectric layer 230 and the second hard mask 218 in composition to ensure sufficient etching selectivity therebetween. Portions of the dielectric layer 240 formed in the openings 236A and 236B are referred to as dielectric layers (or structures) 240A and 240B, respectively, and those formed in the openings 234A and 234B are referred to as the dummy gate structures 240C and 240D, respectively. Accordingly, a width of the dummy gate structures 240C and 240D is the same, or substantially the same, as the width W1 of the openings 236A and 236B discussed in detail above. The dielectric layer 240 may be formed using any suitable method, such as CVD, FCVD, HDP-CVD, the like, or combinations thereof, as shown in FIGS. 8A-8B.

In some embodiments, referring to FIGS. 9A-9B, a CMP process is performed to remove portions of the dielectric layer formed over a top surface of the dielectric layer 230, such that the dummy gate structures 240C and 240D are co-planar, or substantially co-planar, with the second hard mask 218. In some embodiments, referring to FIG. 9C, portions of the dummy gate structures 240C and 240D remain over the top surface of the second hard mask 218 after performing the CMP process. In the present embodiments, the dummy gate structures 240C and 240D extend along sidewalls of the fin structure 222 over a channel region defined in each of the second semiconductor layers 220 and therefore may alternatively be referred to as channel protection structures.

Referring to FIGS. 1A and 10A-10B, the method 100 at operation 108 forms a protective structure 235 over portions of the fin structure 222 in the device region 202P. As shown, the protective structure 235 covers portions of the fin structure 222 adjacent the dummy gate structure 240C, thereby exposing portions of the fin structure 222 that correspond to subsequently-formed source/drain regions in the device region 202N.

In the present embodiments, the protective structure 235 is formed by patterning the dielectric layer 230 using a patterned photoresist layer 232B as shown in FIGS. 10A-10B. The process of patterning the dielectric layer 230 to form the protective structure 235 is similar to the process of forming the fin structure 222 discussed in detail above. After performing the patterning process, the patterned photoresist layer 232B is removed from the transistor device 200 by a suitable method as discussed above.

Subsequently, referring to FIGS. 1A-1B, the method 100 may proceed via the process flow of two paths, Path I and/or Path II, which correspond to different operations. For example, if proceeding via the process flow of Path I, the method 100 performs a doping process (or implantation process) 302 to the exposed portions of the fin structure 222 in the device region 202N after forming the protective structure 235. If proceeding via the process flow of Path II, the method 100 forms a first outer spacer layer 250 over the dummy gate structures 240C and 240D after forming the protective structure 235. For purposes of clarity, Path I and its corresponding operations are discussed in detail with reference to FIGS. 11A-27B and Path II and its corresponding operations are discussed in detail with reference to FIGS. 28A-36B.

Referring to FIGS. 1B and 11A-11B, the method 100 at operation 112 performs the doping process 302 to the exposed portions of the fin structure 222 in the device region 202N.

In some embodiments, the doping process 302 implements a plasma containing one or more dopants of a conductivity that is consistent with the type of transistor device to be formed in the exposed device region. In some embodiments, the dopants are introduced by the doping process 302 through surfaces of the fin structure 222 that extend along the Z direction (i.e., across the X-Z, or vertical, plane). The doping process 302 may be implemented as an ion implantation method utilizing accelerated ions from a plasma source. In some examples, the doping process 302 may be implemented as a pulsed plasma implantation process.

After performing the doping process 302, the transistor device 200 is annealed (or thermally treated) to activate the dopants introduced during the doping process 302. The annealing process may be implemented as a spike annealing process or any other suitable process for activating the implanted dopants.

In the present embodiments, the doping process 302 is configured to introduce dopants of the first conductivity to the exposed portions of the fin structure 222, forming source/drain regions 260 in the second semiconductor layers 220 of the device region 202N. Accordingly, a portion of each second semiconductor layer 220 interposed between a pair of the source/drain regions 260 defines a channel region of the transistor device in the device region 202N. In existing implementations, each dummy gate structure 240C and 240D defines the channel region, which has the width W1 along the X direction, and the source/drain regions 260 are subsequently formed on both sides of the channel region. However, in the present embodiments, because the second semiconductor layers 220 are doped (rather than epitaxially grown) and subsequently annealed, the dopants continue to diffuse through each second semiconductor layer 220 after the doping process 302 is completed. In this regard, the dopants may diffuse along the X direction toward the dummy gate structure 240D and may diffuse into the portion of the second semiconductor layer 220 being protected by the dummy gate structure 240D, effectively shortening a width of the channel region (this width may also be referred to as a gate length) along the X direction. As shown, a channel region 224, defined as the region of the second semiconductor layer 220 that is dopant-free or substantially dopant-free, has a width W2 measured along the X direction. In the present embodiments, the width W2 is less than the width W1, and a difference between W1 and W2 reflects an extent of the dopant diffusion along the X direction.

In the depicted embodiments, the plasma includes an N-type dopant such that the resulting source/drain regions 260 include silicon doped (or implanted) with the N-type dopant for forming an N-type transistor device. Examples of the N-type dopant include arsenic (As), phosphorous (P), other suitable elements, or combinations thereof. If the transistor device to be formed in the exposed device region 202N is configured to be a P-type transistor device, the doping process 302 may implement a P-type dopant such as boron (B), other suitable elements, or combinations thereof. In the present embodiments, the resulting pairs of the source/drain regions 260 are interleaved with the first semiconductor layers 210 along the Z direction and co-extend with their respective channel region 224 along the X direction.

In contrast to performing an epitaxial growth process to form source/drain regions, performing a doping process (e.g., the doping process 302) and a subsequent annealing process to form source/drain regions within each semiconductor layer (e.g., the second semiconductor layers 220) may reduce a distance over which the dopants diffuse to form the source/drain regions, allowing improvement in cycle time and cost, for example, of the overall process. Additionally, absent the need to perform the epitaxial growth process, the doping process provided herein may allow an NS transistor device to be formed to a greater height, offering enhanced routing options for connecting with interconnect structures and other components of an integrated circuit device.

Referring to FIGS. 1B and 12A-13B, the method 100 at operation 114 forms a protective structure 245 over portions of the fin structure 222 in the device region 202N. As shown, the protective structure 245 covers portions of the fin structure 222 adjacent the dummy gate structure 240D, thereby exposing portions of the fin structure 222 that correspond to subsequently-formed source/drain regions in the device region 202P.

In the present embodiments, the protective structure 245 is formed by depositing a dielectric layer 244 over the transistor device 200 and patterning the dielectric layer 244 using a patterned photoresist layer 232C as shown in FIGS. 12A-12B. In some embodiments, the dielectric layer 244 is similar to the dielectric layer 230 in composition and may include, for example, silicon oxide, silicon nitride, silicon oxynitride, silicon carbide, silicon carbonitride, silicon oxycarbonitride, silicon oxycarbide, the like, or combinations thereof. In the present embodiments, the composition of the dielectric layer 244 differs from that of the dielectric layer 230, the first hard mask layer 216, and the second hard mask 218 to ensure sufficient etching selectivity when forming the protective structure 245. The dielectric layer 244 may be deposited over the semiconductor substrate 202 using any suitable method, such as CVD, FCVD, HDP-CVD, the like, or combinations thereof. The process of patterning the dielectric layer 244 to form the protective structure 245 is similar to the process of forming the fin structure 222 discussed in detail above. After performing the etching process, referring to FIGS. 13A-13B, the patterned photoresist layer 232C is removed from the transistor device 200 by a suitable method as discussed above.

Referring to FIGS. 1B and 14A-14B, the method 100 at operation 118 performs a doping process 304 to the exposed portions of the fin structure 222 in the device region 202N.

In some embodiments, the doping process 304 is similar to the doping process 302 with respect to the method by which they are implemented. For example, the doping process 304 may be implemented using a plasma containing one or more dopants of a second conductivity that is consistent with the type of transistor device to be formed in the exposed device region. In some examples, the doping process 302 may be implemented as a pulsed plasma implantation process. After performing the doping process 304, the transistor device 200 is annealed (or thermally treated) to activate the dopants introduced during the doping process 304.

In the present embodiments, the second conductivity type is different from the first conductivity type, i.e., the dopants introduced by the doping process 304 differ from those introduced by the doping process 302. For example, the first conductivity type may be an N-type and the second conductivity type may be P-type, such that the device regions 202N and 202P are configured to provide an N-type device and a P-type device, respectively.

In the present embodiments, the doping process 304 is configured to introduce dopants of the second conductivity to the exposed portions of the fin structure 222, forming source/drain regions 262 in the second semiconductor layers 220 of the device region 202P. Accordingly, a portion of each second semiconductor layer 220 interposed between a pair of the source/drain regions 262 defines a channel region of the transistor device in the device region 202P. Similar to the discussion above with respect to performing the doping process 302, the dopants introduced by the doping process 304 are subsequently annealed and therefore may diffuse along the X direction toward the dummy gate structure 240C and into the portion of the second semiconductor layer 220 being protected by the dummy gate structure 240C, effectively shortening a width of the channel region along the X direction. As shown, a channel region 226, defined as the region of the second semiconductor layer 220 that is dopant-free or substantially dopant-free, has a width W3 that is less than the width W1. As discussed above, the width W3 corresponds to a gate length of the transistor device formed in the device region 202P. In some embodiments, due to the dopants of the doping process 304 being different from those of the doping process 302, the diffusion distance of the dopants in the device region 202P as a result of the doping process 304, i.e., a difference between W1 and W3, may also differ from the diffusion distance of the dopants in the device region 202N as a result of the doping process 302, i.e., the difference between W1 and W2. Accordingly, the width W3 may differ from the width W2 in magnitude. In alternative embodiments, the widths W2 and W3 are substantially the same in magnitude.

In the depicted embodiments, the plasma includes a P-type dopant such that the resulting source/drain regions 262 include silicon doped (or implanted) with the P-type dopant for forming a P-type transistor device. Examples of the P-type dopant include boron (B), other suitable elements, or combinations thereof. If the transistor device to be formed in the exposed device region 202P is configured to be an N-type transistor device, the doping process 304 may implement an N-type dopant such as arsenic (As), phosphorous (P), other suitable elements, or combinations thereof. In the present embodiments, the resulting pairs of the source/drain regions 262 are interleaved with the first semiconductor layers 210 along the Z direction and co-extend with their respective channel region 226 along the X direction. Furthermore, as shown in FIG. 14B, one of the source/drain regions 262 extends continuously from one of adjacent the source/drain region 260 along the X direction.

Referring to FIGS. 1B and 15A-18B, the method 100 at operation 120 cuts the fin structure 222 to separate the device region 202N from the device region 202P.

Figure 15A:
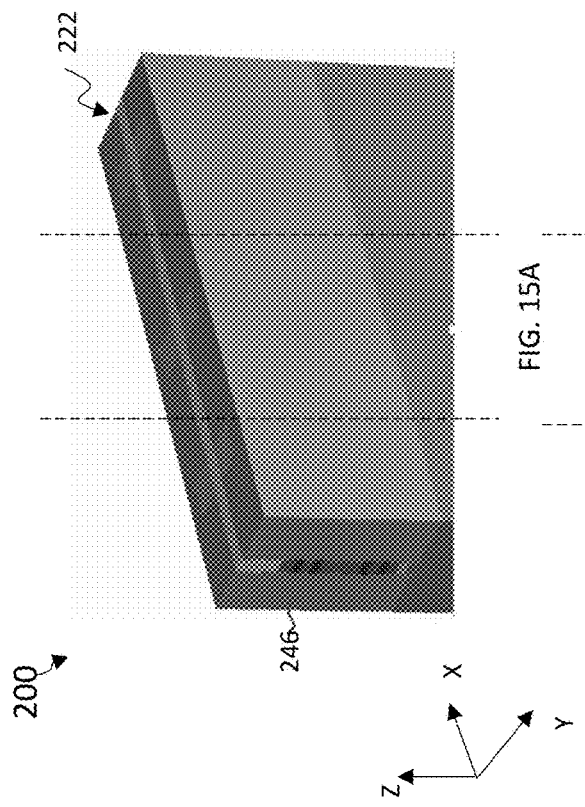
Figure 15B:
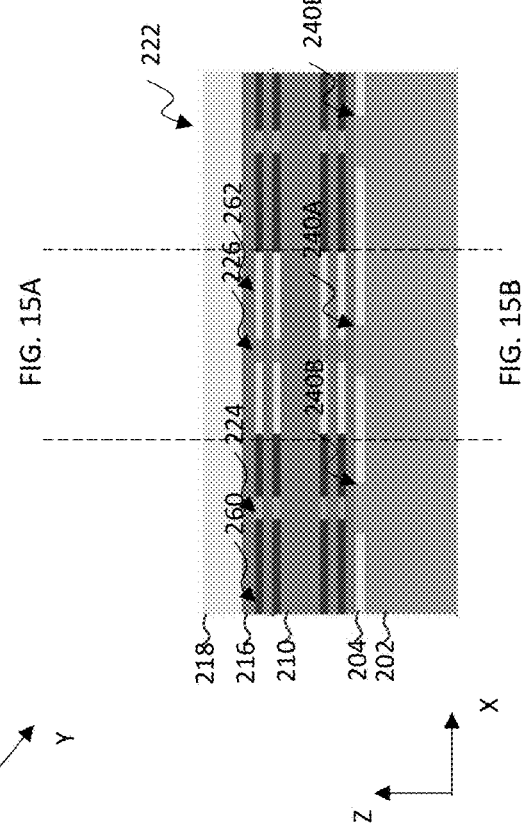
Figure 16A:
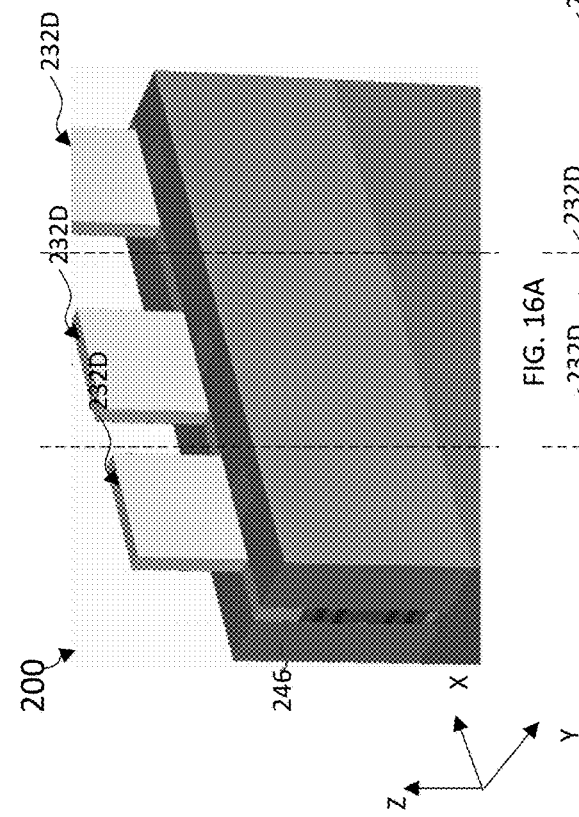
Figure 16B:
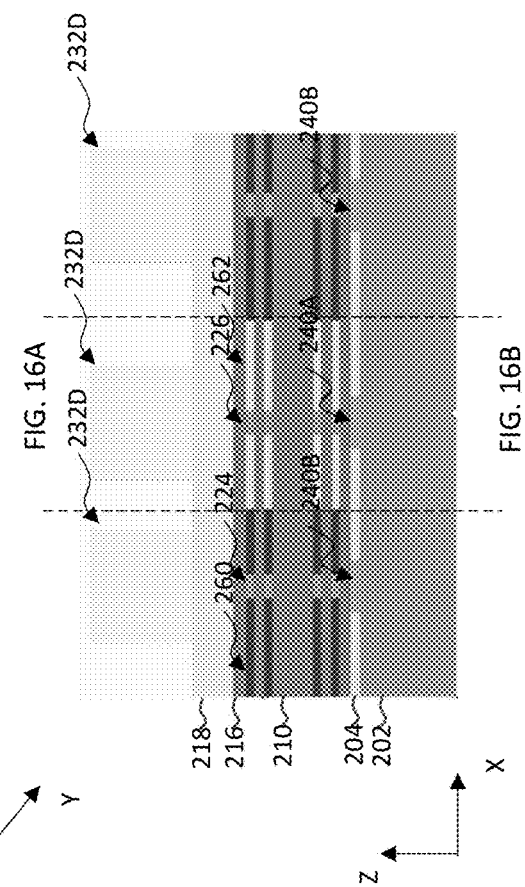
Figure 33A:
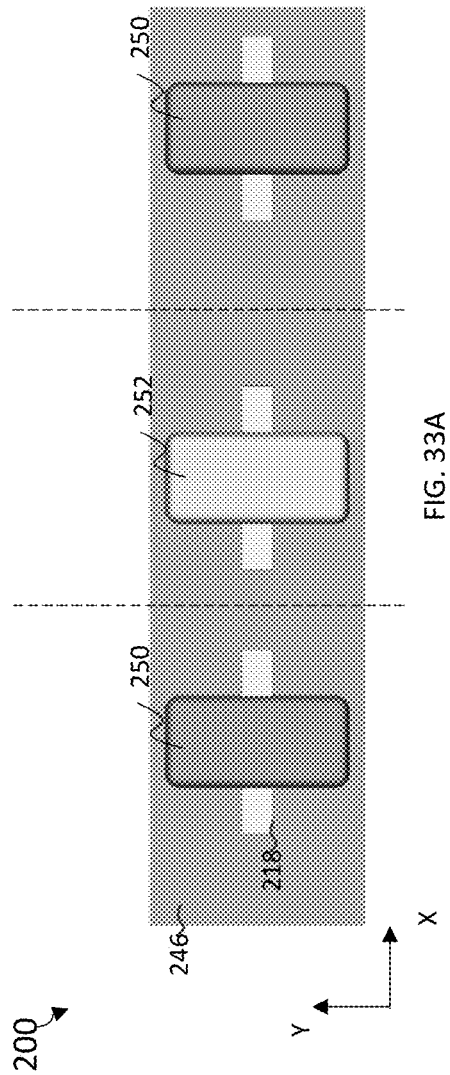
Figure 33B:
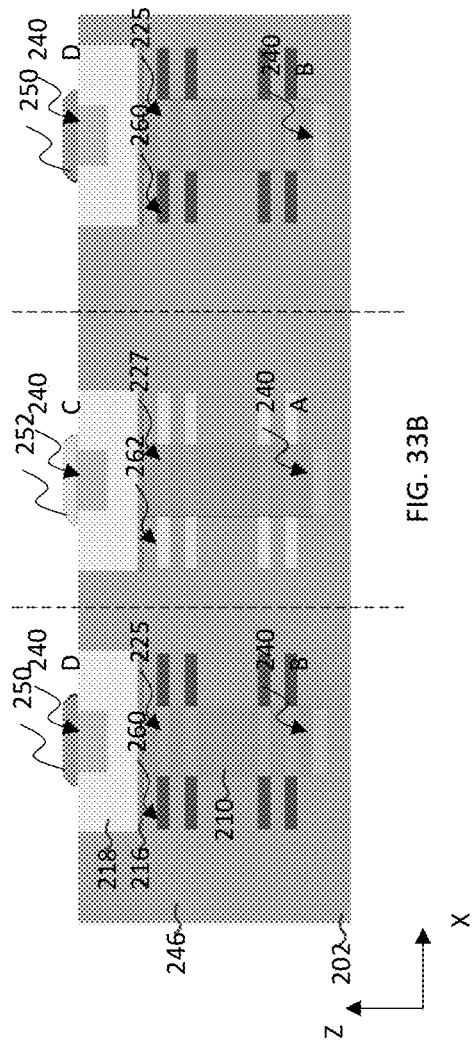
Figure 35A:
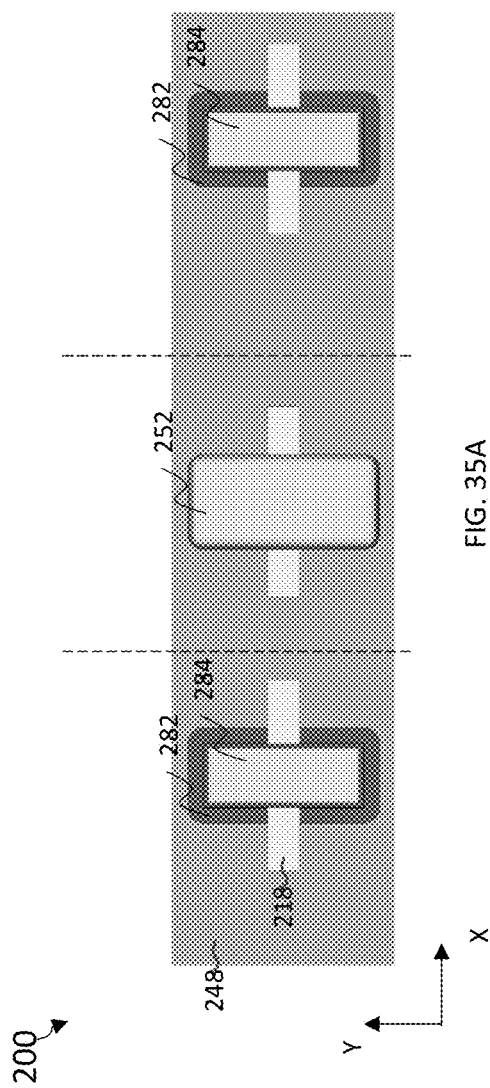
Figure 35B:
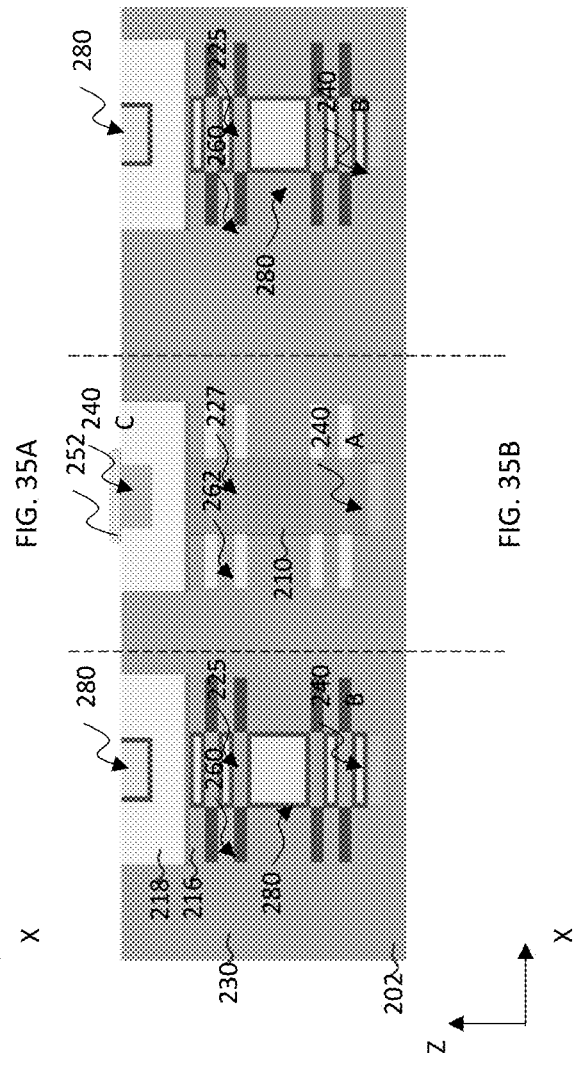

In the present embodiments, cutting the fin structure 222 includes first depositing a dielectric layer 246 over the transistor device 200 as shown in FIGS. 15A-15B and patterning the fin structure 222 using a patterned photoresist layer 232D as shown in FIGS. 16A-16B. In some embodiments, the dielectric layer 246 is similar to the dielectric layer 230 in composition and may include, for example, silicon oxide, silicon nitride, silicon oxynitride, silicon carbide, silicon carbonitride, silicon oxycarbonitride, silicon oxycarbide, the like, or combinations thereof. In the present embodiments, the composition of the dielectric layer 246 differs from that of the dielectric layer 230, the first hard mask layer 216, and the second hard mask 218 to ensure sufficient etching selectivity when cutting the fin structure 222. In some examples, the dielectric layer 246 may include PSG, BSG, BPSG, USG, or the like, or combinations thereof. The dielectric layer 246 may be deposited by any suitable method, such as CVD, PECVD, or FCVD, and subsequently planarized by a CMP process. The process of patterning the fin structure 222 using the patterned photoresist layer 232D is similar to the process of forming the fin structure 222 discussed in detail above.

For example, patterning the fin structure 222 using the patterned photoresist layer 232D as an etch mask includes performing at least one etching process to remove portions of the fin structure 222 exposed by the patterned photoresist layer 232D. The patterning process forms trenches 264 between portions of the dielectric layer 246. In other words, the device regions 202N and 202P are separated by the trenches 264 along the X direction. The etching process may include a dry etching process, an RIE process, a wet etching process, the like, or combinations thereof. In some embodiments, the etching process may be anisotropic. In some embodiments, the mask layer, including the first hard mask layer 216 and the second hard mask 218, and the stack of the semiconductor layers 210 and 220, including the source/drain regions 260 and 262 and the channel regions 224 and 226, may be removed in separate etching processes. In some embodiment, referring to FIGS. 17A-17B and 18A-18B, portions of the sacrificial layer 204 remain intact, or substantially intact, in the trenches 264 after performing the patterning process at operation 120. After performing the etching process, the patterned photoresist layer 232D is removed from the transistor device 200 by any suitable method as discussed above.

Referring to FIGS. 1B and 19A-20B, the method 100 at operation 122 trims the semiconductor layers 210 and 220 within each device region 202N and 202P.

In the present embodiments, portions of the semiconductor layers 210 and 220 are trimmed by at least one etching process at operation 122. For example, referring to FIGS. 19A-19B, the at least one etching process removes portions of the second semiconductor layers 220 (e.g., the source/drain regions 260 and 262, etc.) embedded in sidewalls of the dielectric layer 246 and subsequently (or concurrently) trims the first semiconductor layers 210 to a width that is substantially the same as the width W1 of the dielectric layers 240A and 240B (i.e., the trimmed first semiconductor layers 210 have sidewalls that are substantially aligned with sidewalls of the dielectric layers 240A and 240B). Thereafter, referring to FIGS. 20A-20B, the portions of the sacrificial layer 204 remaining in the trenches 264a are trimmed such that a top surface of the semiconductor substrate 202 is exposed in the trenches 264.

Referring to FIGS. 1C and 21A-22C, the method 100 at operation 124 forms a dielectric layer 248 over the transistor device 200.

As shown in FIGS. 21A-21B, the dielectric layer 248 is formed over the transistor device 200 to fill the trenches 264, thereby insulating the device regions 202N and 202P. In some embodiments, the dielectric layer 248 is similar to the dielectric layer 230 in composition and may include, for example, silicon oxide, silicon nitride, silicon oxynitride, silicon carbide, silicon carbonitride, silicon oxycarbonitride, silicon oxycarbide, PSG, BSG, BPSG, USG, the like, or combinations thereof. In the present embodiments, the composition of the dielectric layer 248 differs from that of the dielectric layer 240, the first hard mask layer 216, and the second hard mask 218 to ensure sufficient etching selectivity during subsequent operations. The dielectric layer 248 may be deposited by any suitable method, such as CVD, PECVD, or FCVD. Referring to FIGS. 22A-22C, portions of the dielectric layers 246 and 248 are planarized by a CMP process to expose a top surface of the dummy gate structures 240C and 240D.

Referring to FIGS. 1C and 23A-23C, the method 100 at operation 126 removes the dummy gate structures 240C and 240D to form trenches (i.e., gate trenches) 270A and 270B, respectively.

Due to the etching selectivity between the dielectric layers 240, 248 (or 246), and the second hard mask 218, the exposed dummy gate structures 240C and 240D are selectively removed to form the trenches 270A and 270B. The dummy gate structures 240C and 240D can be removed by an etching process, such as RIE or chemical oxide removal (COR). After removing the dummy gate structures 240C and 240D, the top surface of the semiconductor substrate 202 is exposed in the trenches 270A and 270B.

In the present embodiments, a width of the trenches 270A and 270B is substantially the same as the width W1, which is the dimension of the dielectric layers 240A and 240B along the X direction. Notably, the width W1 is greater than both the width W2 (i.e., the width of the channel region 224) and the width W3 (i.e., the width of the channel region 226) as discussed in detail above.

Referring to FIGS. 1C and 24A-24C, the method 100 at operation 128 removes the first semiconductor layers 210 to form openings (or trenches) 272 between the second semiconductor layers 220 (i.e., the source/drain regions 260 and 262).

In the present embodiments, the first semiconductor layers 210 are removed from the fin structure 222 to form the openings 272 interleaved with the source/drain regions 260/262 and their corresponding channel regions 224/226, which remain substantially intact after performing an etching process. In some embodiments, the etching process may implement an etchant, such as hydrochloric acid (HCl), that selectively removes the first semiconductor layers 210 without removing, or substantially removing, the source/drain regions 260/262 and their corresponding channel regions 224/226.

Referring to FIGS. 1C and 25A-25C operation 130, the method 100 at operation 130 forms an inner spacer layer 274 to partially fill the trenches 270A and 270B and the openings 272.

In the present embodiments, the inner spacer layer 274 includes any dielectric material suitable for insulating sidewalls of a gate structure. For example, the inner spacer layer 274 may include silicon oxide, silicon nitride, silicon oxynitride, silicon carbide, silicon carbonitride, silicon oxycarbonitride, silicon oxycarbide, the like, or combinations thereof. In some embodiments, the inner spacer layer 274 may have a composition that is the same as or different from that of the dielectric layers 240A and 240B (i.e., the dielectric layer 240). In the present embodiments, the inner spacer layer 274 is formed to interleave with the source/drain regions 260 and the source/drain regions 262, respectively, along the Z direction. In other words, the inner spacer layer 274 laterally overlaps with portions of the source/drain regions 260 and 262 in their respective device regions.

In the present embodiments, the inner spacer layer 274 is conformally deposited on sidewalls of the trenches 270A and 270B as well as in the openings 272 to a thickness T1. The thickness T1 is configured to account for the extent of out-diffusion of the dopants from the source/drain regions 260 toward the channel region 224 in the device region 202N and from the source/drain regions 262 toward the channel region 226 in the device region 202P. In this regard, the thickness T1 is determined based on the difference between the width W1 and the width W2 (or the width W3). Accordingly, the presence of the inner spacer layer 274 prevents the subsequently-formed metal gate structure from overlapping with and directly contacting the source/drain regions 260 and 262, thereby avoiding shorting between the metal gate structure and the corresponding source/drain regions. In some embodiments, the thickness T1 may be determined (by estimation, for example) based on factors that influence the out-diffusion of the dopants including, for example, the type of dopants and the temperature at which annealing is performed to activate the dopants.

In the present embodiments, the inner spacer layer 274 is formed conformally by an ALD process, which is configured to deposit the inner spacer layer 274 one atomic layer at a time. Other deposition methods, such as CVD, may also be applicable in the present embodiments. In some embodiments, the inner spacer layer 274 is selectively formed on surfaces of the dielectric layers 246 and/or 248 in the trenches 270A and 270B as well as in the openings 272. In some embodiments, the number of deposition cycles implemented by the ALD process is determined based on the type of dielectric material selected for the inner spacer layer 274 and an estimated value of the thickness T1 using one or more of the factors discussed above. A CMP process may be performed subsequently to planarize a top surface of the inner spacer layer 274. Accordingly, portions of the inner spacer layer 274 remaining on sidewalls of the trenches 270A and 270B as well as the openings 272 are referred to as inner spacers configured to insulate the subsequently-formed metal gate structures from their corresponding source/drain regions.

Referring to FIGS. 1C and 26A-27B, the method 100 at operation 132 forms a metal gate structure over the inner spacer layer 274 to fill the trenches 270A and 270B and the openings 272.

In the present embodiments, forming the metal gate structures 280 and 290 includes forming at least a gate dielectric layer 282 over the inner spacer layer 274, as shown in FIGS. 26A-26B, and a gate electrode 284 over the gate dielectric layer 282, as shown in FIGS. 27A-27B, where the gate dielectric layer 282 wraps around the channel region 224 or 226 of each second semiconductor layer 220.

The gate dielectric layer 282 may include a suitable dielectric material, such as a high-k dielectric material having a metal oxide or a silicate of Hf, Al, Zr, La, Mg, Ba, Ti, Pb, and combinations thereof. The gate dielectric layer 282 may include a stack of different dielectric materials. The gate dielectric layer 282 may be deposited using any suitable method, including, for example, ALD, CVD, PECVD, physical vapor deposition (PVD), the like, or combinations thereof. In some embodiments, the gate dielectric layer 282 may optionally include a substantially thin oxide (e.g., silicon oxide, or $SiO_x$) layer.

The gate electrode 284 may include a number of gate metal sections abutted to each other along the Z direction. Each of the gate metal sections may extend not only along a horizontal plane (e.g., the plane expanded along the X direction and the Y direction), but also along a vertical direction (e.g., the Z direction). As such, two adjacent ones of the gate metal sections can adjoin together to wrap around a corresponding one of the second semiconductor layers 220, with the gate dielectric layer 282 disposed therebetween.

The gate electrode 284 may include a stack of multiple metal materials. For example, the gate electrode 284 may include a work function layer, such as a P-type work function layer, an N-type work function layer, multi-layers thereof, or combinations thereof. The work function layer may also be referred to as a work function metal. Example work function metals may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, the like, or combinations thereof. The gate electrode 284 may further include a metal fill layer over the work function layer, where the metal fill layer may include W, Cu, Ru, Al, Ag, the like, or combinations thereof. The gate electrode 284 may further include other suitable layers, such as a barrier layer, an adhesion layer, a capping layer, other layers, or combinations thereof. The various layers of the gate electrode 284 may be deposited by CVD, PVD, ALD, plating, other suitable methods, or combinations thereof, and subsequently planarized using one or more CMP processes.

In some embodiments, though not depicted, the metal gate structure 280 configured to form a transistor device 200A in the device region 202P may differ from the metal gate structure 290 configured to form a transistor device 200B in the device region 202N in composition. For example, if the transistor device 200A is configured as a P-type device, the metal gate structure 280 may include work function metal layer(s) configured to provide a threshold voltage Vt consistent with a P-type device, and if the transistor device 200B is configured as an N-type device, the metal gate structure 290 may include work function metal layer(s) configured to provide a Vt consistent with an N-type device. In this regard, the metal gate structures 280 and 290 may be formed separately from one another using one or more patterned masks, for example.

Referring to FIG. 1C, the method 100 at operation 134 may perform additional operations to the transistor device 200. In one example, device-level contacts including source/drain contacts and gate contacts are formed to electrically connect the source/drain regions (e.g., the source/drain regions 260 and 262) and the metal gate structures (e.g., the metal gate structures 280 and 290), respectively, with interconnect structures, such as conductive lines and vias, formed in multiple dielectric layers.

In some embodiments, referring collectively to FIGS. 1A-1C and 28A-36B, the method 100 may be implemented via the process flow of Path II, which includes operations in addition and/or alternative to those of Path I discussed in detail above.

For example, as shown in FIGS. 28A-28C, after forming the protective structure 235 over the device region 202P at operation 108, the method 100 proceeds to operation 110, instead of operation 112 as in the case of Path I, to selectively forming a first outer spacer layer 250 over the dummy gate structures 240C and 240D, as shown in FIGS. 29A-29C. It is noted that FIG. 28B is similar to FIG. 9C, where both illustrate embodiments of the dummy gate structures 240C and 240D having a top surface co-planar, or substantially co-planar, with the second hard mask 218.

In the present embodiments, the first outer spacer layer 250 includes any suitable dielectric material, such as silicon oxide, silicon nitride, silicon oxynitride, silicon carbide, silicon carbonitride, silicon oxycarbonitride, silicon oxycarbide, the like, or combinations thereof. In the present embodiments, composition of the first outer spacer layer 250 may be the same as or different from that of the dummy gate structures 240C and 240D (i.e., the dielectric layer 240). In the present embodiments, the first outer spacer layer 250 is selectively formed on the dielectric layer 240 such that it wraps around the exposed surfaces of the dummy gate structures 240C and 240D without being formed, or substantially formed, on the fin structure 222. The first outer spacer layer 250 may be deposited by any suitable method, such as ALD, CVD, the like, or combinations thereof. As shown in FIGS. 29B and 29C, the first outer spacer layer 250 is formed to a width W4 along the X direction, where the width W4 is greater than the width W1, which corresponds to the width of the dummy gate structures 240C and 240D.

Subsequently, referring to FIGS. 1B and 29A-29C, the method 100 at operation 112 performs a doping process 306 to form the source/drain regions 260 adjacent the dummy gate structure 240D. The doping process 306 is similar to the doping process 302, the details of which has been discussed above with respect to FIGS. 11A-11B. For example, the doping process 306 may be a pulsed plasma doping process. The types of dopants implanted by the doping process 302 depend on the type of transistor device desired and may include an N-type dopant or a P-type dopant as discussed in detail above. An annealing process is subsequently performed to activate the dopants introduced by the doping process 306.

Similar to the discussion above, the annealing process cause the dopants in the second semiconductor layers 220 to diffuse from the source/drain regions 260 toward a channel region 225 interposed therebetween. However, the presence of the first outer spacer layer 250 inhibits or limits the diffusion of the dopants, such that the channel region 225 is defined to have the width W1, which corresponds to the width of the dummy gate structure 240D. In contrast, for the embodiments according to the process flow of Path I illustrated in FIGS. 11A-27C, the channel region 224 has a width W2 that is less than the width W1 due to the diffusion of the dopants that laterally extends the source/drain regions 260 toward the channel region 224. Stated differently, the first outer spacer layer 250 is formed outside sidewalls of the dummy gate structure 240D and the inner spacer layer 274 is formed within the sidewalls of the dummy gate structure 240D (see FIG. 25B, for example).

In the present embodiments, a thickness T2 of the first outer spacer layer 250 is configured to account for the diffusion distance of the dopants, thereby limiting a boundary of the source/drain regions 260 to align with the sidewall of the dummy gate structure 240D (or the dielectric layer 240B). Similar to the discussion of the thickness T1, the thickness T2 may be estimated based on factors such as the type of dopants and annealing temperature before depositing the first outer spacer layer 250 at operation 110.

Referring to FIGS. 1B and 30A-30C, the method 100 at operation 114 forms the protective structure 245 over the device region 202N to expose the device region 202P in a process similar to that discussed above with respect to FIGS. 12A-12B. In some embodiments, after forming the protective structure 245, portions of the first outer spacer layer 250 formed in the device region 202P (i.e., over the dummy gate structure 240C) are removed to expose the underlying dummy gate structure 240C.

Referring to FIGS. 1B and 30A-30C, the method 100 at operation 116 selectively forms a second outer spacer layer 252 over the dummy gate structure 240C.

In the present embodiments, the second outer spacer layer 252 includes any suitable dielectric material, such as silicon oxide, silicon nitride, silicon oxynitride, silicon carbide, silicon carbonitride, silicon oxycarbonitride, silicon oxycarbide, the like, or combinations thereof. In the present embodiments, composition of the second outer spacer layer 252 differs from that of the first outer spacer layer 250 to ensure sufficient etching selectivity therebetween during subsequent operations. In the present embodiments, the second outer spacer layer 252 is selectively formed on the dielectric layer 240 such that it wraps around the exposed surfaces of the dummy gate structure 240C without being formed, or substantially formed, on the fin structure 222. The second outer spacer layer 252 may be deposited by any suitable method, such as ALD, CVD, the like, or combinations thereof. Similar to the first outer spacer layer 250, referring to FIGS. 31A-31B, the second outer spacer layer 252 is formed to the width W4 that is greater than the width W1, where the width W1 corresponds to the width of the dummy gate structure 240C.

Referring to FIGS. 1B and 31A-31B, the method 100 at operation 118 performs a doping process 308 to form the source/drain regions 262 adjacent the dummy gate structure 240C. The doping process 308 is similar to the doping process 304, the details of which has been discussed above with respect to FIGS. 14A-14B. For example, the doping process 308 may be a pulsed plasma doping process. The types of dopants implanted by the doping process 308 depend on the type of transistor device desired and may include an N-type dopant or a P-type dopant as discussed in detail above. In the present embodiments, the doping processes 306 and 308 implement dopants of different conductivity types to form transistor devices of different conductivity types. An annealing process is subsequently performed to activate the dopants introduced by the doping process 308.

Similar to the discussion above with respect to FIGS. 29A-29C, the presence of the second outer spacer layer 252 limits the diffusion of the dopants, such that a channel region 227 interposed between the source/drain regions 262 is defined to have the width W1, which corresponds to the width of the dummy gate structure 240C. In other words, the second outer spacer layer 252 is formed outside sidewalls of the dummy gate structure 240C and the inner spacer layer 274 is formed within the sidewalls of the dummy gate structure 240C (see FIG. 25B, for example).

In the present embodiments, a thickness T3 of the second outer spacer layer 252 is configured to account for the diffusion distance of the dopants, thereby limiting a boundary of the source/drain regions 262 to align with the sidewalls of the dummy gate structure 240C (or the dielectric layer 240A). In this regard, the thickness T3 may be estimated based on factors such as the type of dopants and annealing temperature before depositing the second outer spacer layer 252 at operation 118.

Referring to FIGS. 1B and 32A-33B, the method 100 at operations 120-124 cuts the fin structure 222 to separate the device regions 202N and 202P, trims the semiconductor layers 210 and 220, and subsequently forms the dielectric layer 248 over the transistor device 200, similar to the embodiments discussed with respect to FIGS. 15A-22C. In the present embodiments, the first semiconductor layers 210 are trimmed to align with the dielectric layers 240A and 240B, i.e., having the width W1, while the trimmed second semiconductor layers 220 (including the source/drain regions 260 and 262 and their respective channel regions 225 and 227) extend outward from the trimmed first semiconductor layers 210 along the X direction.

Referring to FIGS. 1C and 34A-35B, the method 100 at operations 126, 128, and 132 removes the dummy gate structures 240D and the first semiconductor layers 210 in the device region 202N to form the trenches 270B and the openings 272, respectively, and subsequently forms a metal gate structure 290 in the trenches 270B and the openings 272, similar to the embodiments discussed with respect to FIGS. 23A-24C. The metal gate structure 290 may include at least a gate electrode 294 over a gate dielectric layer 292, which are similar to the gate electrode 284 and the gate dielectric layer 282, respectively, as discussed in detail above. In the present embodiments, the metal gate structures 280 and 290 are formed separately.

In some examples, referring to FIGS. 34A-34B, a top portion of the first outer spacer layer 250 may be selectively removed, without removing or substantially removing the second outer spacer layer 252, in a first etching process (e.g., a directional etching process) to expose the underlying dummy gate structure 240D, which is subsequently removed in a second etching process to form the trench 270B. Alternatively, the top portion of the first outer spacer layer 250 and the dummy gate structure 240D may be removed in the same etching process to form the trench 270B. In the present embodiments, portions of the first outer spacer layer 250 surround the trench 270B (see FIG. 34A) and remain as outer spacers on sidewalls of the metal gate structure 290. Notably, the difference in composition between the first outer spacer layer 250 and the second outer spacer layer 252 allows them to be selectively processed without using any patterned photoresist layer. Thereafter, one or more CMP processes may be performed to remove portions of the gate dielectric layer 292 and the gate electrode 294 from a top surface of the transistor device 200, thereby exposing the remaining portions of the first outer spacer layer 250 as shown in FIGS. 36A-36B.

Figure 36A:
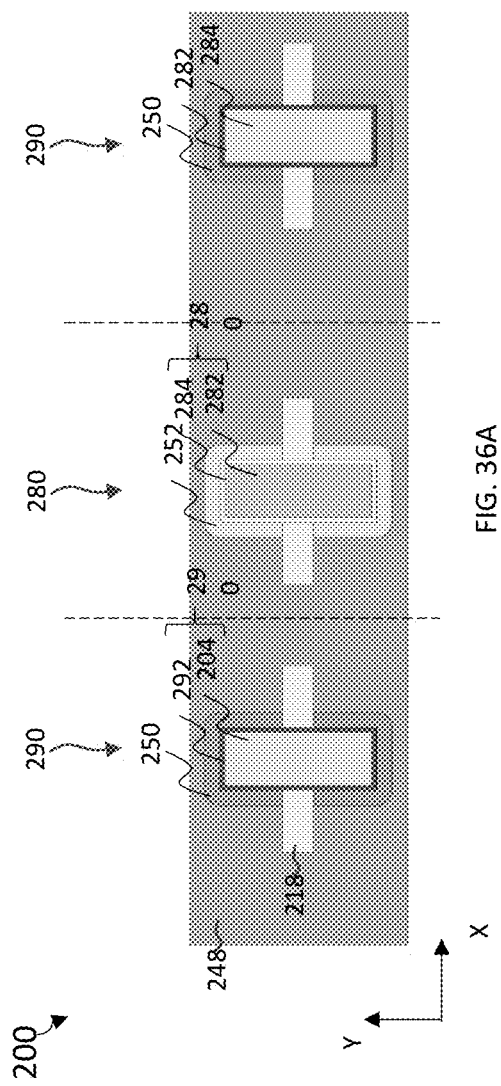
Figure 36B:
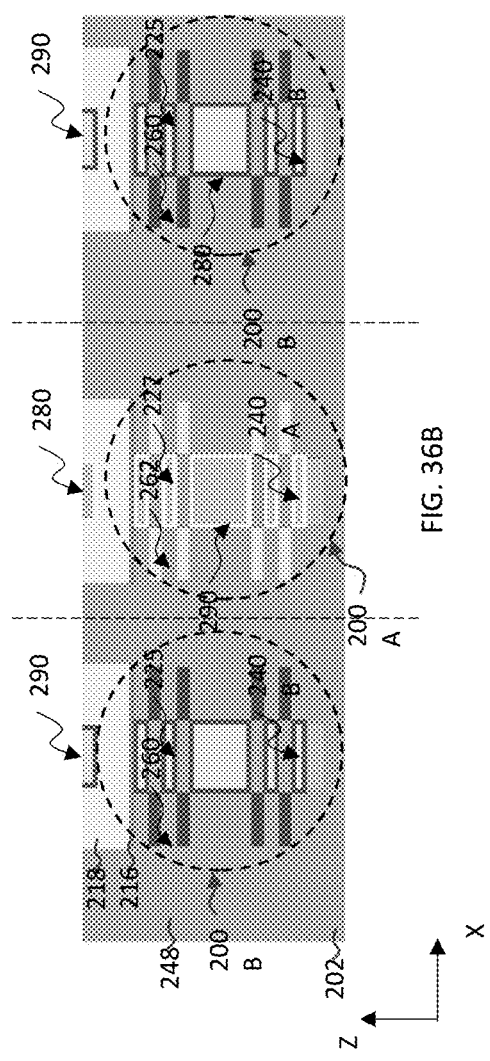

Referring to FIGS. 36A-36B, the method 100 repeats operations 126, 128, and 132 by removing the dummy gate structures 240C and the first semiconductor layers 210 in the device region 202P, forming the trenches 270A and the openings 272, respectively, and subsequently forming the metal gate structure 280 in the trenches 270A and the openings 272.

Similar to the formation of the metal gate structure 290, forming the metal gate structure 280 may include selectively removing a top portion of the first outer spacer layer 250 in a first etching process (e.g., a directional etching process), without removing or substantially removing the metal gate structure 290, to expose the underlying dummy gate structure 240C, which is subsequently removed in a second etching process to form the trench 270A. Alternatively, the top portion of the second outer spacer layer 252 and the dummy gate structure 240C may be removed in the same etching process to form the trench 270A. In the present embodiments, portions of the second outer spacer layer 252 surround the trench 270A and remain as outer spacers on sidewalls of the metal gate structure 280. Thereafter, one or more CMP processes may be performed to remove portions of the gate dielectric layer 282 the gate electrode 284 from a top surface of the transistor device 200, thereby exposing the remaining portions of the second outer spacer layer 252 as shown in FIGS. 36A-36B.

FIGS. 37 and 38 illustrate portions of the transistor device 200 as depicted in FIGS. 27A-27C and 36A-36B, respectively, and components such as the dielectric layer 248 has been removed in FIGS. 37 and 38 for purposes of illustration only. As shown, although both the inner spacer layer 274 and the outer spacer layers 250 and 252 are formed to surround the metal gate structures 280 and 290, portions of the inner spacer layer 274 are interleaved with the source/drain regions 260 and 262, i.e., stacked between the second semiconductor layers 220 along the Z direction, whereas the outer spacer layers 252 and 254 are not formed between adjacent second semiconductor layers along the Z direction. Additionally, outer sidewalls of the inner spacer layer 274 are aligned with the sidewalls of the dielectric layers 240A and 240B as shown in FIG. 37, whereas the outer spacer layers 250 and 252 each extend outward from the sidewalls of the dielectric layers 240A and 240B as shown in FIG. 38.

In some embodiments, the method 100 may be implemented via the process flow of Path I, during which the inner spacer layer 274 is formed to insulate the metal gate structures 280 and 290 from adjacent source/drain regions 260/262, or via the process flow of Path II, during which the outer spacer layers 250 and 252 are formed on the sidewalls of the metal gate structures 290 and 280, respectively. In some embodiments, the method 100 may be implemented via a process flow that merges Path I with Path II, i.e., the outer spacer layers 250 and 252 and the inner spacer layer 274 are both formed on the sidewalls of the metal gate structures 290 and 280, respectively.

Figure 2:
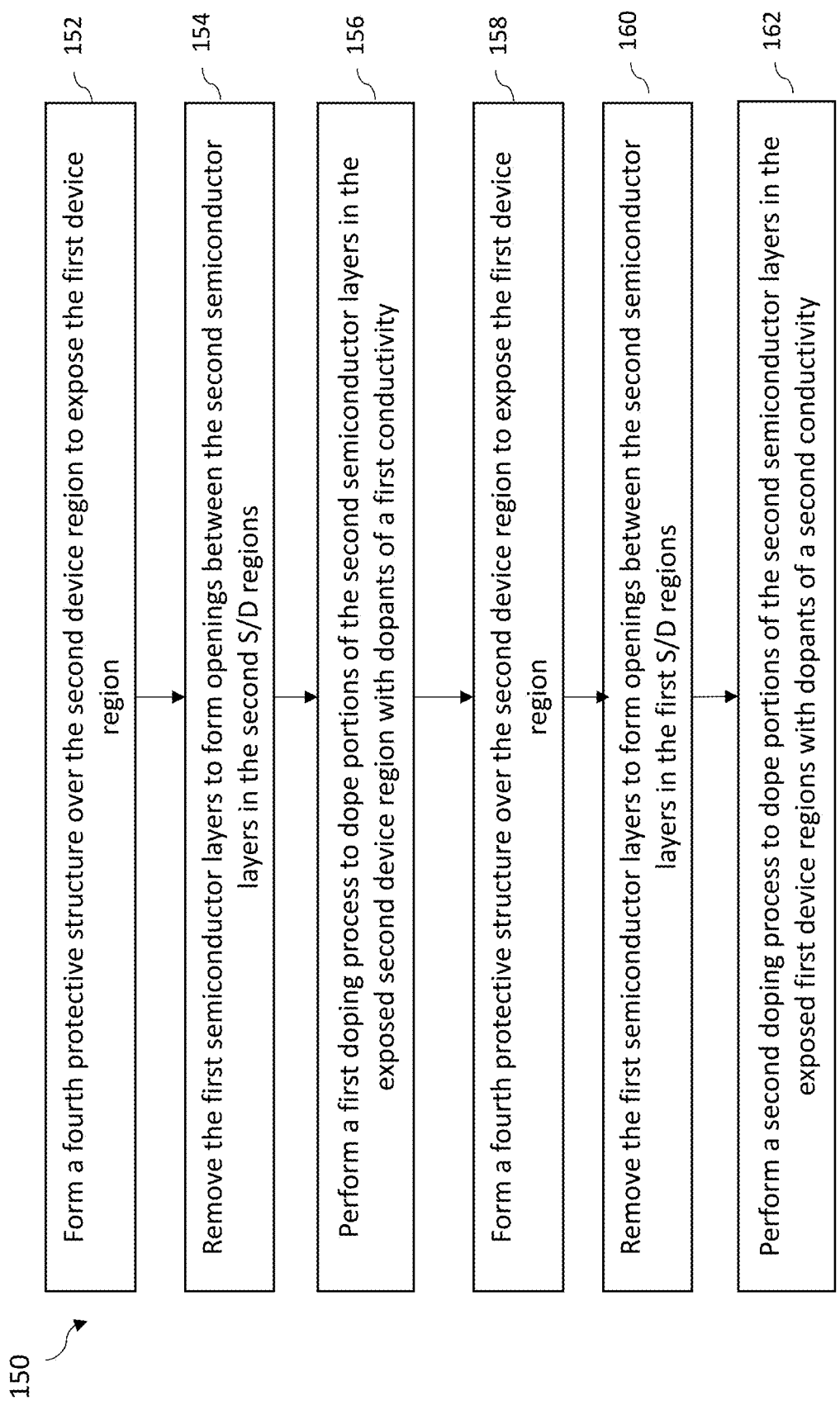
FIG. 2 illustrates a flow chart of an example method to make an example semiconductor device, in accordance with some embodiments.

In some embodiments, referring to a flow chart of a method 150 depicted in FIG. 2, the present disclosure provides an embodiment of forming the transistor device 200 alternative to the method 100 discussed above. It is noted that the method 150 is merely an example, and is not intended to limit the present disclosure. Accordingly, it is understood that additional operations may be provided before, during, and after the method 150 of FIG. 2, and that some other operations may only be briefly described herein. The method 150 is discussed in reference to FIGS. 39-45.

In some embodiments, the method 150 may be implemented to replace some, but not all, operations of the method 100, e.g., operations 106-118, directed to forming the source/drain regions 260 and 262 in the device regions 202N and 202P, respectively. In this regard, the method 150 is discussed in reference to some embodiments of the method 100 provided above. For example, FIGS. 39-45 illustrate cross-sectional views of the transistor device 200 along the line BB' as shown in FIG. 3A. For clarity purposes, it is noted that the dummy gate structures 240C and 240D are referenced in FIGS. 39-45 to merely indicate their relative position with respect to the fin structure 222.

Figure 39:
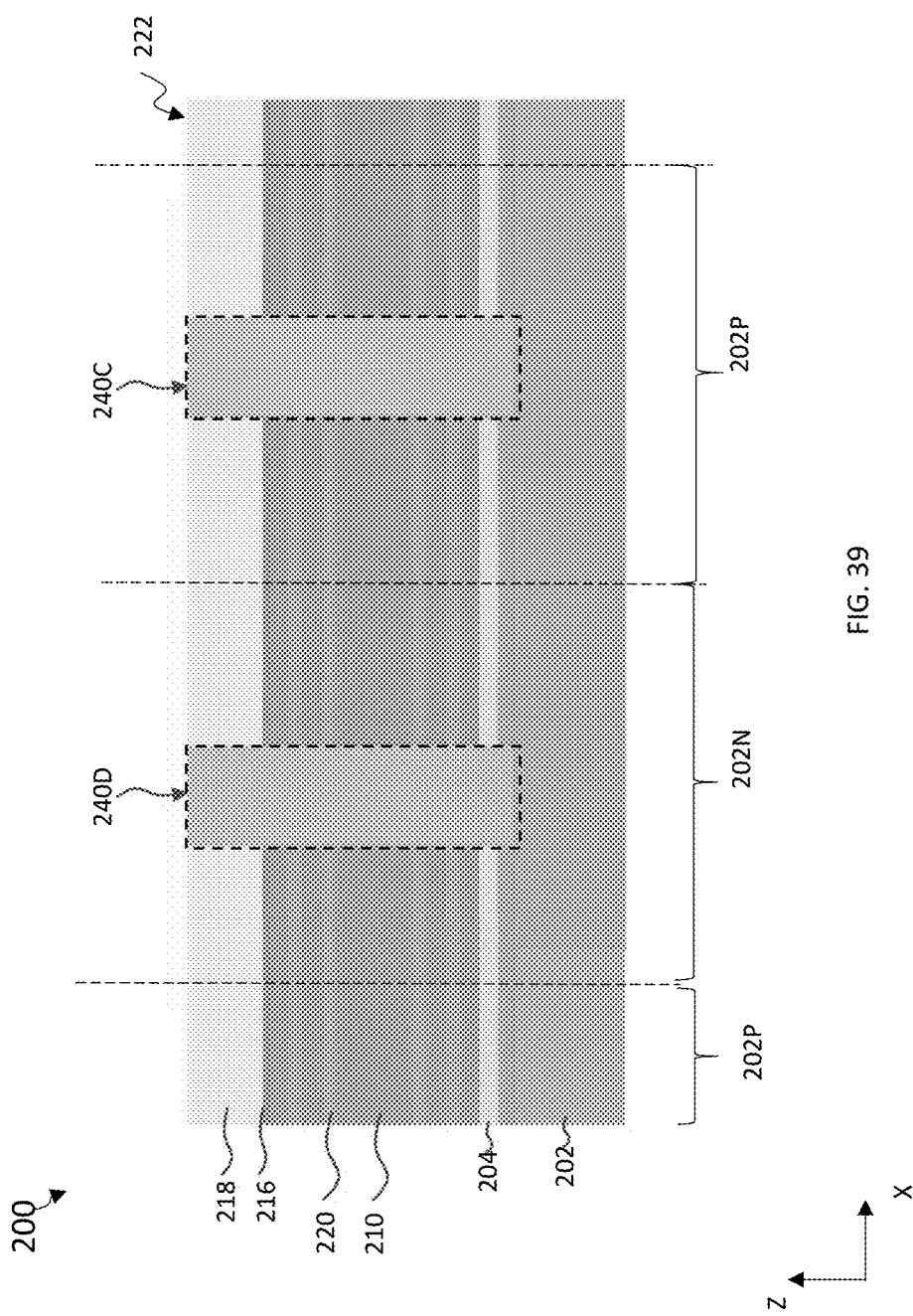
FIGS. 39, 40, 41, 42, 43, 44, and 45 illustrate cross-sectional views along line BB' of the example semiconductor device as shown in FIG. 3A during intermediate stages of the method of FIGS. 1A-1C and/or 2, in accordance with some embodiments.
Figure 40:
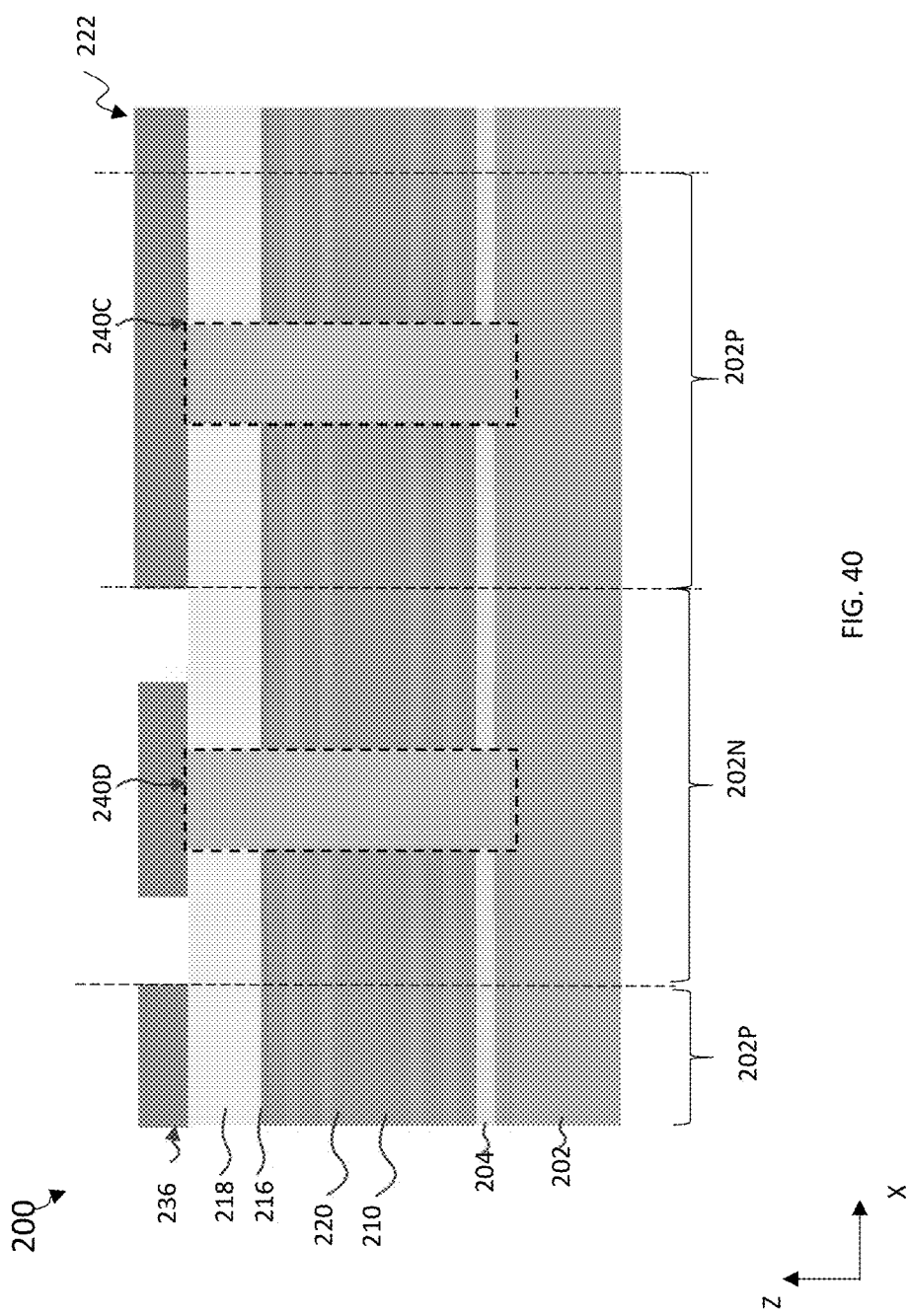

Referring to FIGS. 2A and 39-40, the method 150 at operation 152 forms a protective structure 236 over the transistor device 200. The transistor device 200 shown in FIG. 39 may be fabricated according to some embodiments of the method 100, e.g., via a process flow including operations 102-106.

The protective structure 236 may be similar to the protective structure 235 as shown in FIGS. 11A-11B with respect to composition and methods of formation. For example, the protective structure 236 may include a suitable dielectric material that has a composition different from that of at least the dummy gate structures 240C and 240D and may be formed by applying a patterned photoresist layer similar to the patterned photoresist layer 232B. In some embodiments, referring to FIG. 40, the protective structure 236 is formed to expose portions of the fin structure 222 adjacent a region configured to form the transistor device 200B in the device region 202N.

Figure 41:
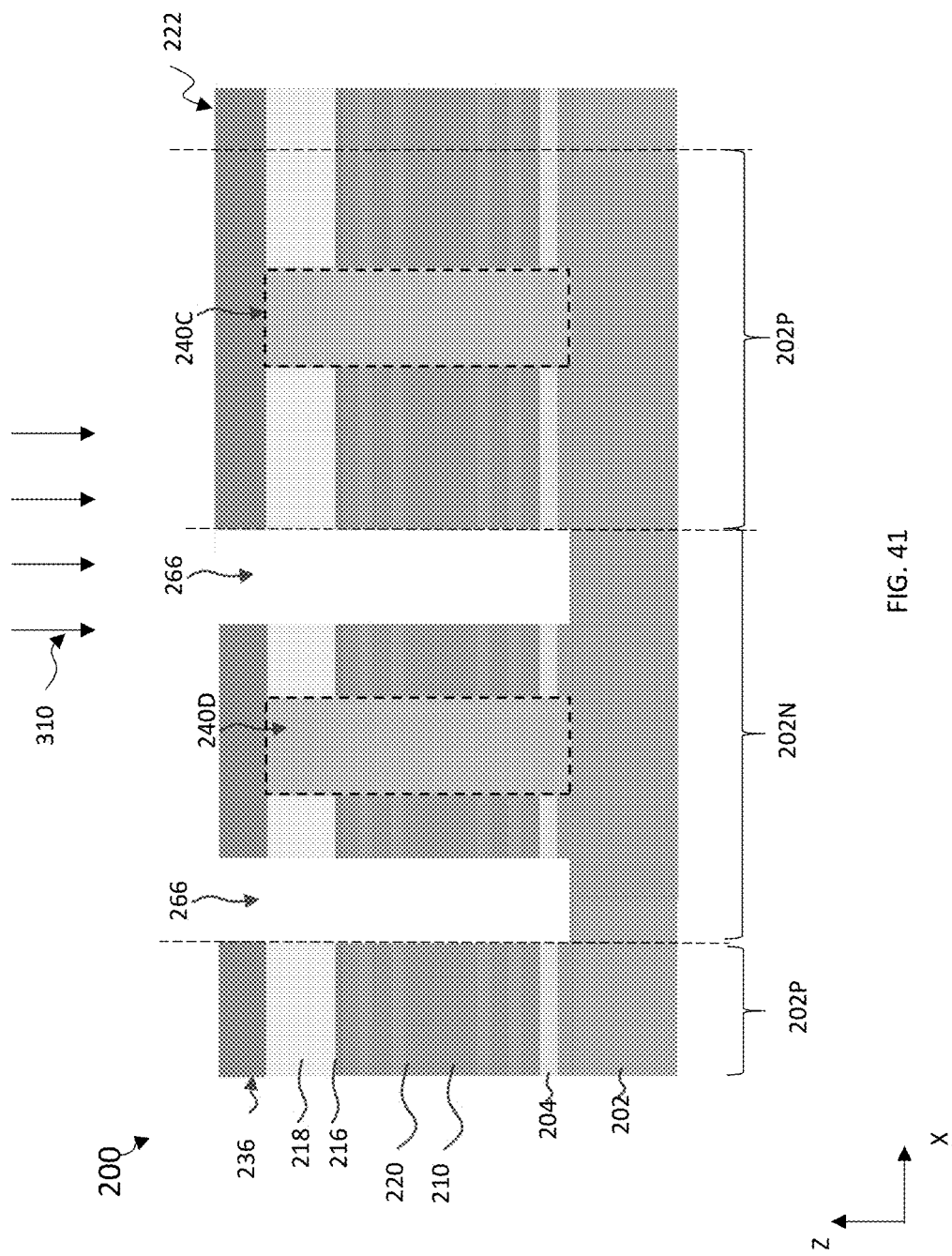
Figure 42:
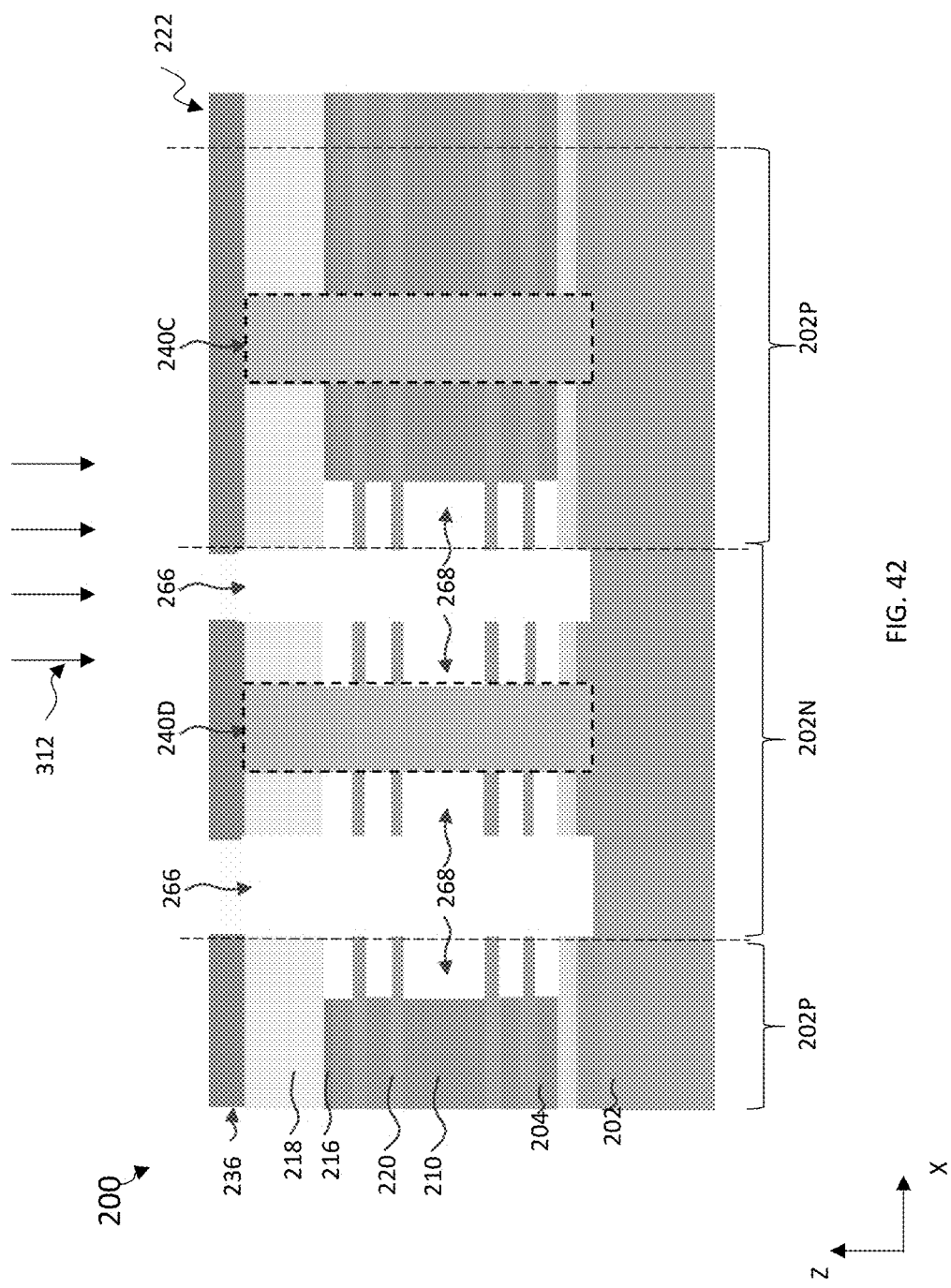

Referring to FIGS. 2 and 41-42, the method 150 at operation 154 removes portions of the fin structure 222 to form openings in the first semiconductor layers 210 adjacent the dummy gate structure 240D. In this regard, the removal of the first semiconductor layers 210 at operation 128 of the method 100 is performed before, rather than after, forming the source/drain regions 260 during the process flow of the method 150.

In the present embodiments, referring to FIG. 41, an etching process 310 is implemented to form trenches (or openings) 266 in the fin structure 222 using the protective structure 236 as an etch mask. The trenches 266 extend through the fin structure 222 along the Z direction to expose the underlying semiconductor substrate 202. The etching process 310 may be a dry etching process, an RIE process, a wet etching process, the like, or combinations thereof. In some examples, the etching process 310 may be anisotropic.

Subsequently, referring to FIG. 42, an etching process 312 is implemented to remove portions of the first semiconductor layers 210 and form openings 268 interleaved with the second semiconductor layers 220. In this regard, the etching process 312 laterally extends the trenches 266. The etching process 312 may be a dry etching process, an RIE process, a wet etching process, the like, or combinations thereof. In some examples, the etching process 312 may be isotropic.

Figure 43:
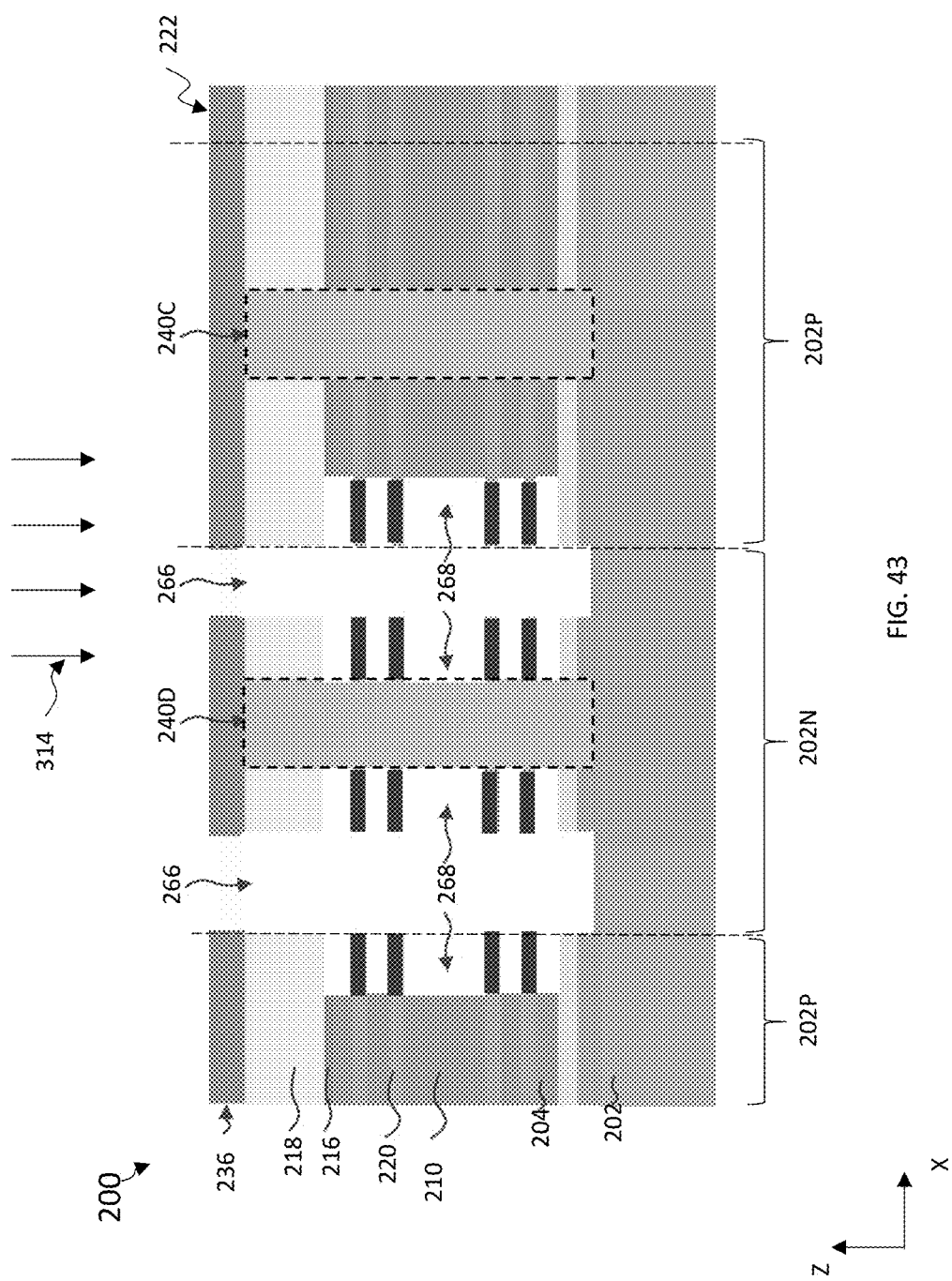
Figure 44:
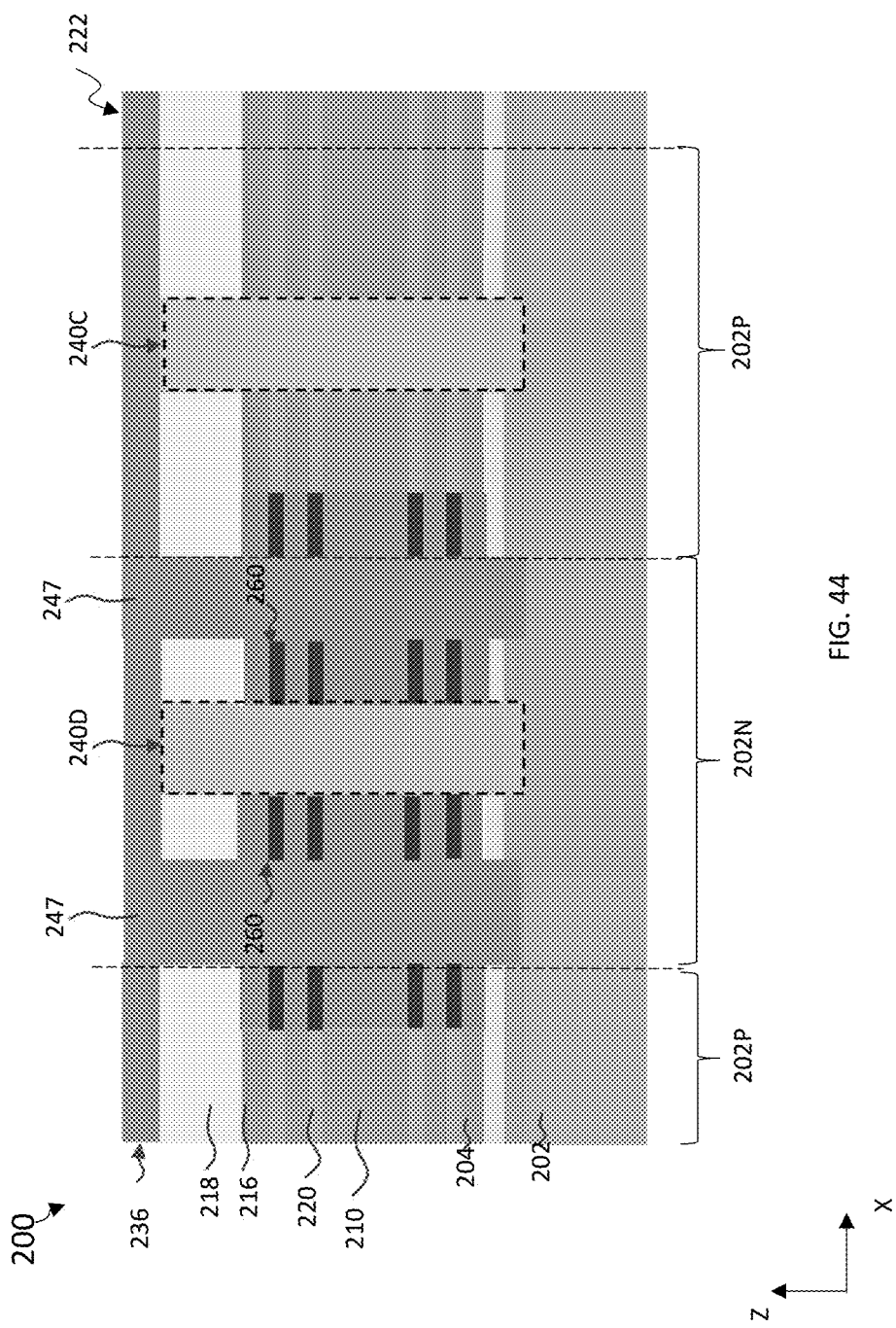

Referring to FIGS. 2 and 43-44, the method 150 at operation 156 performs a doping process 314 to the exposed portions of the fin structure 222 in the device region 202N.

In some embodiments, referring to FIG. 43, the doping process 314 is similar to the doping process 302 with respect to the method by which they are implemented. For example, the doping process 314 may be implemented using a plasma containing one or more dopants of the first conductivity (e.g., N-type dopants in the depicted embodiments) that is consistent with the type of transistor device to be formed in the exposed device region. In some examples, the doping process 314 may be implemented as a pulsed plasma implantation process. After performing the doping process 314, the transistor device 200 is annealed (or thermally treated) to activate the dopants introduced during the doping process 314.

In the present embodiments, similar to the doping process 302, the doping process 314 is configured to introduce dopants of the first conductivity to the exposed portions of the fin structure 222, forming source/drain regions 260 in the second semiconductor layers 220 of the device region 202N. However, as shown in FIGS. 11A-11B, the doping process 302 is applied to portions of the fin structure 222 in which the first semiconductor layers 210 remain intact (i.e., the trenches 266 and the openings 268 are absent), such that the dopants may only be introduced through surfaces of the second semiconductor layers 220 that extend along the Z direction (i.e., across the X-Z, or vertical, plane). In contrast, the doping process 314 can introduce the dopants through surfaces of the second semiconductor layers 220 that extend along both the Z direction and along the Y direction (i.e., across the X-Y, or horizontal, plane) exposed by the trenches 266 and 268, i.e., between adjacent second semiconductor layers 220 stacked upon one another. In some instances, the diffusion of the dopants along both the vertical and the horizontal planes may result in shorter diffusion time, for example.

Subsequently, referring to FIG. 44, the method 150 at operation 156 deposits a dielectric layer 247 to fill the trenches 266 and the openings 268. The dielectric layer 247 may include any suitable dielectric material, such as silicon oxide, silicon nitride, silicon oxynitride, silicon carbide, silicon carbonitride, silicon oxycarbonitride, silicon oxycarbide, the like, or combinations thereof, the like, or combinations thereof. In some embodiments, the dielectric layer 267 has the same composition as the dielectric layer 246. The dielectric layer 247 may be deposited by any suitable method, such as CVD, PECVD, or FCVD, and subsequently planarized by a CMP process.

Figure 45:
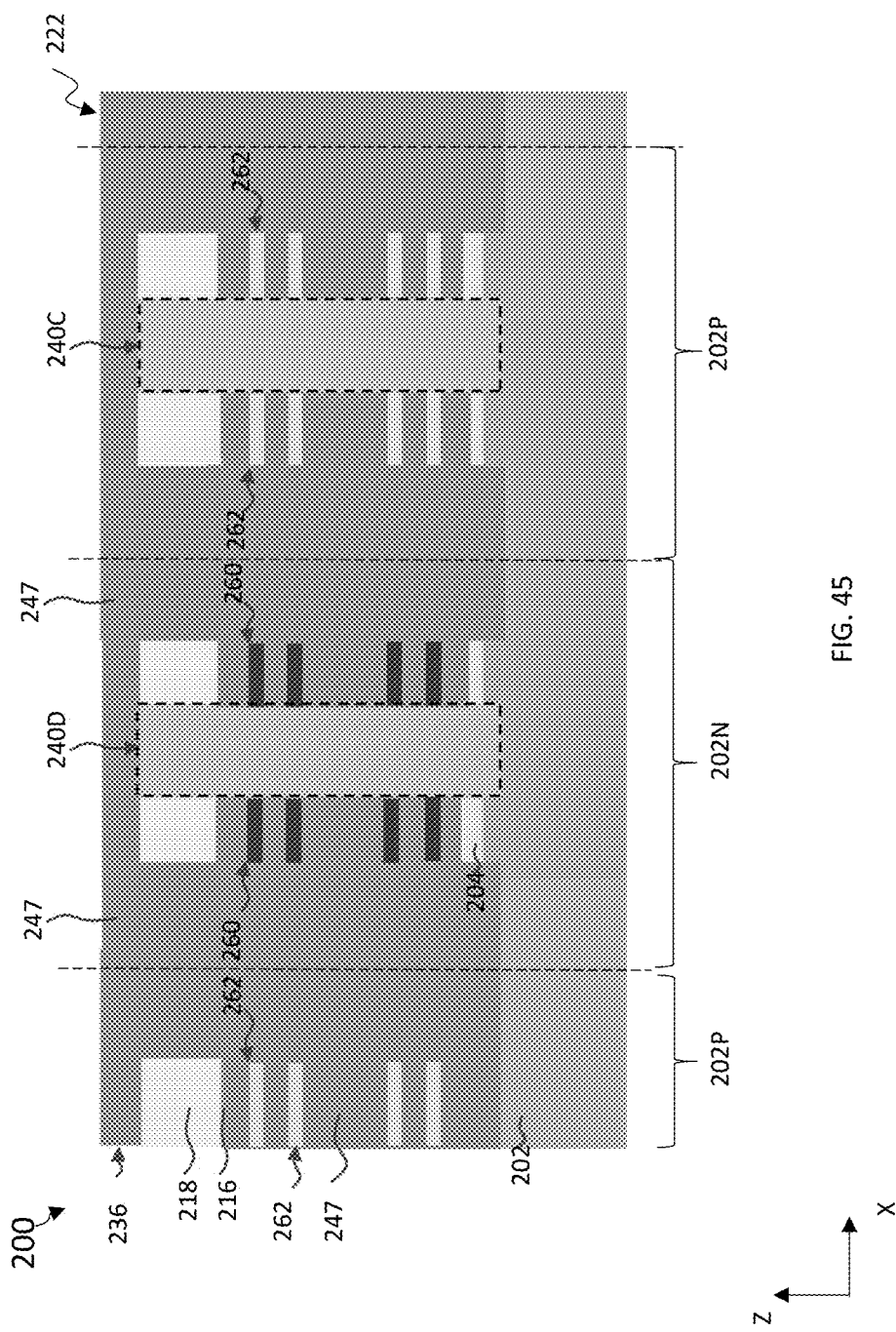

Referring to FIGS. 2 and 45, the method 150 at operations 158-162 forms the source/drain regions 262 adjacent the dummy gate structure 240C in a process analogous to operations 152-156 for forming the source/drain regions 260. As such, the resulting transistor device 200 is similar in structure to that depicted in FIGS. 22A-22C according to some embodiments.

Subsequently, additional operations are performed to the transistor device 200 according to some embodiments of the method 100. For example, the dummy gate structures 240C and 204D are removed to form the trenches 270A and 270B, respectively (see operation 126 and FIGS. 23A-23C); portions of the dielectric layer 247 interleaved with the source/drain regions 260 and 262 are removed to form the openings 272 (similar to operation 128 and FIGS. 24A-24C); the inner spacer layer 274 is deposited in the trenches 270A and 270B and the openings 272 (if Path I is implemented; see operation 130 and FIGS. 25A-25C); and the metal gate structures 280 and 290 are formed to fill the trenches 270A and 270B and the openings 272 (see operation 132 and FIGS. 26A-27B). Additional operations, such as those discussed above with respect to operation 134, may be performed thereafter to complete fabrication of the transistor device 200.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
    forming a fin structure over a substrate, the fin structure including alternating first semiconductor layers and second semiconductor layers stacked along a vertical direction, the first and the second semiconductor layers having different composition;
    forming a dummy gate structure over the fin structure;
    depositing an outer spacer layer on the dummy gate structure;
    performing a plasma doping process to form source/drain regions in each second semiconductor layer adjacent the dummy gate structure along a lateral direction, wherein a portion of each second semiconductor layer interposing between the source/drain regions defines a channel region;
    forming a dielectric layer over the fin structure;
    removing the dummy gate structure to form a gate trench in the dielectric layer;
    selectively removing the first semiconductor layers to form openings interleaved with the second semiconductor layers; and
    forming a metal gate structure in the gate trench and the openings.

2. The method of claim 1, wherein the first semiconductor layers each include silicon germanium (SiGe) having Ge at a first concentration and the second semiconductor layers each include silicon (Si), and wherein the dielectric layer is a first dielectric layer, the method further comprising:
    forming a third semiconductor layer over the substrate before forming the fin structure, the third semiconductor layer including SiGe having Ge at a second concentration different from the first concentration; and
    selectively removing portions of the third semiconductor layer to form recesses below the fin structure, such that the forming of the dummy gate structure forms a second dielectric layer in the recesses, the second dielectric layer differing from the first dielectric layer in composition.

3. The method of claim 2, wherein the second dielectric layer has a first width along the lateral direction and the outer spacer layer has a second width along the lateral direction that is greater than the first width.

4. The method of claim 1, wherein the channel region has a first width along the lateral direction and the outer spacer layer has a second width along the lateral direction that is greater than the first width.

5. The method of claim 1, wherein the depositing of the outer spacer layer is implemented such that the outer spacer layer is selectively deposited on the dummy gate structure.

6. The method of claim 1, wherein the forming of the metal gate structure includes forming a gate dielectric layer and forming a metal gate electrode over the gate dielectric layer.

7. The method of claim 1, wherein the outer spacer layer laterally overlaps with a portion of the source/drain regions.

8. The method of claim 1, wherein the plasma doping process is performed after the forming of the dummy gate structure and before the selective removing of the first semiconductor layers.

9. The method of claim 1, wherein the plasma doping process is performed after the selective removing of the first semiconductor layers and before the forming of the metal gate structure.

10. A method, comprising:
    forming a fin structure over a substrate, the fin structure including a sacrificial layer and alternating first semiconductor layers and second semiconductor layers stacked along a vertical direction over the sacrificial layer;
    selectively removing portions of the sacrificial layer to form recesses;
    depositing a dielectric material over the substrate to form a dummy gate structure over the fin structure and to form a first dielectric layer in the recesses;
    depositing an outer spacer layer on the dummy gate structure;
    performing a plasma doping process to form source/drain regions in each second semiconductor layer adjacent the dummy gate structure, thereby defining a channel region interposed between the source/drain regions;
    forming a second dielectric layer over the dummy gate structure and the source/drain regions;
    removing the dummy gate structure to form a first opening in the second dielectric layer;
    removing the first semiconductor layers to form second openings interleaved with the second semiconductor layers; and
    forming a metal gate structure to fill the first and the second openings.

11. The method of claim 10, wherein the outer spacer layer laterally extends over a sidewall of the channel region.

12. The method of claim 10, wherein the first and the second dielectric layers differ in composition.

13. The method of claim 10, wherein the performing of the plasma doping process includes doping portions of each second semiconductor layer with an N-type dopant or a P-type dopant.

14. The method of claim 10, further comprising depositing an inner spacer layer to partially fill the first and the second openings before forming the metal gate structure.

15. The method of claim 10, wherein the first dielectric layer has a first width along the lateral direction and the outer spacer layer has a second width along the lateral direction that is greater than the first width.

16. The method of claim 10, wherein the depositing of the outer spacer layer includes selectively forming the outer spacer layer on the dummy gate structure.

17. The method of claim 10, wherein a top portion of the metal gate structure is formed over a top surface of the fin structure, wherein a gate length of the top portion of the metal gate structure is the same as a width of the first dielectric layer along the lateral direction.

18. A method, comprising:
    forming a fin structure over a substrate, the fin structure including alternating silicon germanium (SiGe) layers and silicon (Si) layers stacked along a vertical direction;
    forming a dummy gate structure over the fin structure;
    depositing an outer spacer layer on the dummy gate structure;
    performing a plasma doping process to form source/drain regions in each Si layer adjacent the dummy gate structure along a lateral direction, wherein a portion of each Si layer interposing between the source/drain regions defines a channel region, and wherein the outer spacer layer overlaps with a portion of the source/drain regions along the lateral direction;
    forming a dielectric layer over the fin structure;
    removing the dummy gate structure to form a gate trench in the dielectric layer;

selectively removing the SiGe layers to form openings interleaved with the Si layers along the vertical direction; and forming a metal gate structure to fill the gate trench and the openings.

19. The method of claim 18, wherein the performing of the plasma doping process includes doping portions of each Si layer with an N-type dopant or a P-type dopant.

20. The method of claim 18, wherein the SiGe layers are the first SiGe layers and the dielectric layer is a first dielectric layer, the first SiGe layers including Ge at a first concentration, the method further comprising:

forming a second SiGe layer over the substrate before forming the fin structure, the second SiGe layer includes Ge at a second concentration different from the first concentration; and selectively removing portions of the second SiGe layer to form recesses below the fin structure, such that the forming of the dummy gate structure forms a second dielectric layer in the recesses, the second dielectric layer differing from the first dielectric layer in composition.

* * * * *